United States Patent

Kawakubo et al.

[11] Patent Number: 5,654,553
[45] Date of Patent: Aug. 5, 1997

[54] PROJECTION EXPOSURE APPARATUS HAVING AN ALIGNMENT SENSOR FOR ALIGNING A MASK IMAGE WITH A SUBSTRATE

[75] Inventors: Masaharu Kawakubo, Kanagawa-ken; Masahiko Okumura, Tokyo, both of Japan

[73] Assignee: Nikon Corporation, Tokyo, Japan

[21] Appl. No.: 630,852

[22] Filed: Apr. 11, 1996

Related U.S. Application Data

[63] Continuation-in-part of Ser. No. 468,753, Jun. 6, 1995, abandoned, which is a continuation-in-part of Ser. No. 257,676, Jun. 8, 1994, abandoned.

[30] Foreign Application Priority Data

| Jun. 10, 1993 | [JP] | Japan | 5-138490 |
| Nov. 12, 1993 | [JP] | Japan | 5-283235 |
| Sep. 14, 1994 | [JP] | Japan | 6-219884 |
| Dec. 9, 1994 | [JP] | Japan | 6-304524 |

[51] Int. Cl.⁶ ............... G01N 21/86; G11B 7/00; G11B 11/03; G03B 27/53
[52] U.S. Cl. ............... 250/548; 356/400; 355/53
[58] Field of Search ............... 250/548, 559.29, 250/559.3, 559.44, 557, 201.2, 201.4, 201.6, 201.7; 356/399, 400, 401; 355/52, 53, 55, 56

[56] References Cited

U.S. PATENT DOCUMENTS

| 4,558,949 | 12/1985 | Uehara et al. | 356/400 |
| 4,704,020 | 11/1987 | Murakami et al. | 353/122 |
| 4,780,617 | 10/1988 | Umatate et al. | 250/548 |
| 4,962,318 | 10/1990 | Nishi | 250/548 |
| 5,124,562 | 6/1992 | Kawashima et al. | 250/548 |
| 5,153,678 | 10/1992 | Ota | 250/548 |
| 5,191,200 | 3/1993 | Van der Werf et al. | 250/548 |
| 5,194,744 | 3/1993 | Aoki et al. | 250/548 |
| 5,243,195 | 9/1993 | Nishi | 250/548 |
| 5,408,083 | 4/1995 | Hirakawa et al. | 250/201.2 |
| 5,489,966 | 2/1996 | Kawashima et al. | 355/53 |

*Primary Examiner*—Edward P. Westin
*Assistant Examiner*—John R. Lee
*Attorney, Agent, or Firm*—Armstrong, Westerman, Hattori, McLeland & Naughton

[57] ABSTRACT

A projection exposure apparatus according to the present invention comprises a projection optical system for projecting a pattern of a mask onto each of exposure areas on a photosensitive substrate, and a mark detection system of off-axis type spaced apart from the projection optical system by a predetermined distance. According to one aspect of the present invention, the projection exposure apparatus includes a calculating means for determining an offset amount of an imaging position of the projection optical system and an offset amount of a best focus position of the mark detection system of off-axis type on the basis of the amount of change of an environmental condition to which the projection optical system and the mark detection system are subjected. The detection of a positioning mark on the substrate is performed after a surface of the substrate at a position of the mark detection system is aligned with the best focus position, in consideration of the offset amounts. According to another aspect of the present invention, the projection exposure apparatus includes an inclination amount measuring means for determining an inclination amount of the surface of the substrate. The detection of the positioning mark on the substrate is performed after the inclination is eliminated or after the surface of the substrate at the position of the mark detection system is aligned with the best focus position in consideration of the inclination amount.

31 Claims, 14 Drawing Sheets

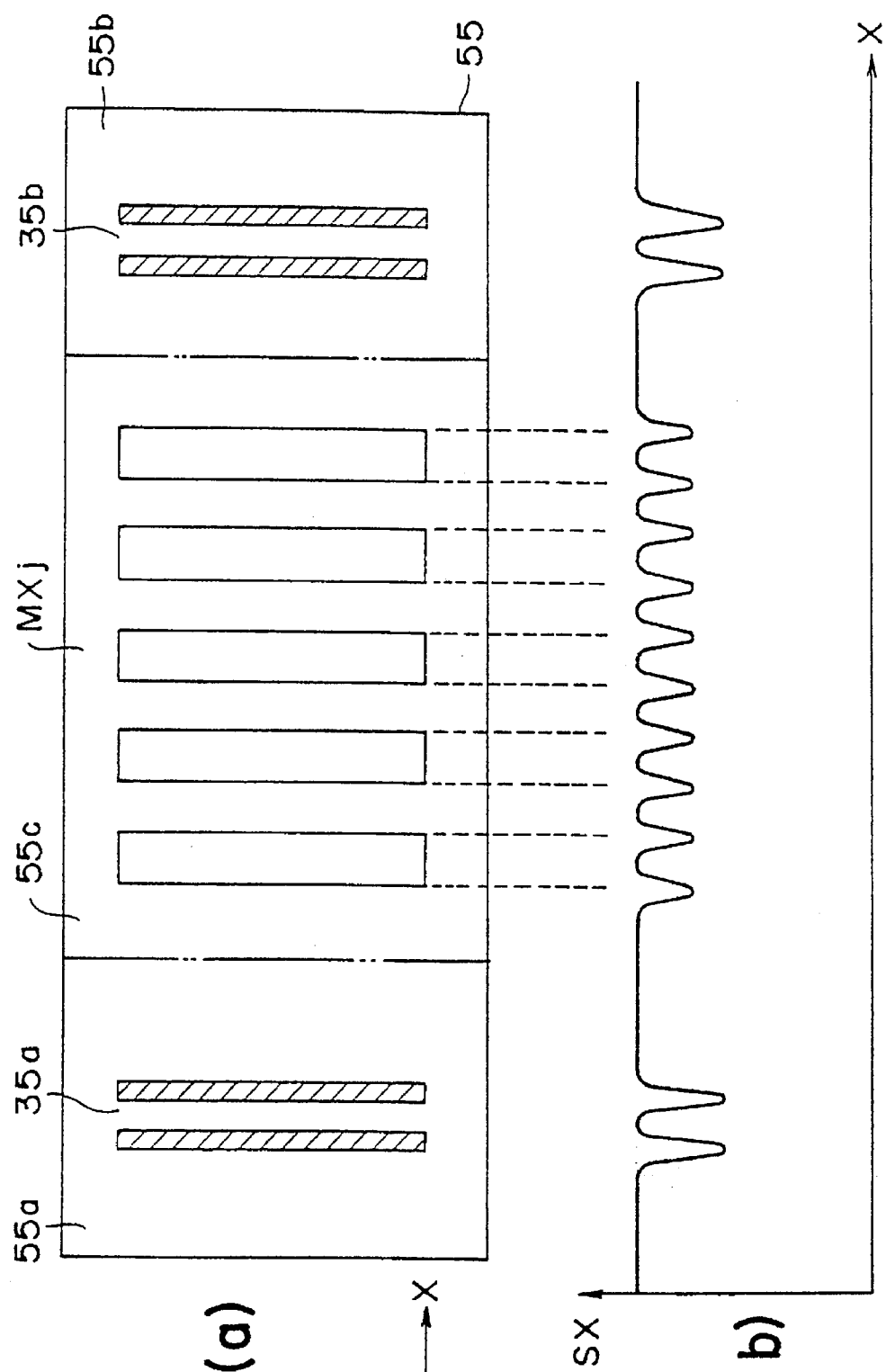

PROJECTION EXPOSURE APPARATUS HAVING AN ALIGNMENT SENSOR FOR ALIGNING A MASK IMAGE WITH A SUBSTRATE

RELATED APPLICATION

This application is a continuation-in-part of patent application Ser. No. 05/468,753 (filed on Jun. 6, 1995), now abandoned, which is also a continuation-in-part of patent application Ser. No. 08/257,676 (filed on Jun. 8, 1994)now abandoned.

BACKGROUND OF THE INVENTION

1. Field of the Invention

The present invention relates to a projection exposure apparatus, and more particularly, it relates to a projection exposure apparatus wherein alignment marks formed on a substrate such as a semiconductor wafer, a liquid crystal display element plate or the like are detected by an alignment sensor of off-axis type in order to align a mask image with such a substrate.

2. Related Background Art

In manufacturing semiconductor elements, liquid crystal elements or the like by means of a photo-lithography process, there have been used projection exposure apparatuses wherein a pattern image of a photo-mask such as a reticle is projected by means of a projection optical system so as to expose each of shot areas on a substrate (for example, a wafer, a glass plate and the like) on which photosensitive material is coated.

The conventional projection exposure apparatus had to include an auto-focus mechanism for detecting a position (height) of the wafer along the optical axis of the projection optical system at an exposure position so as to make the detected position coincide with an imaging plane of the projection optical system. Recently, since the depth of focus is made shallower as a result of an effort to obtain a high resolution of the projection optical system, there arose a problem that the resolution in the exposure area of the wafer and the uniformity of line width of the projected image are worsened when unevenness and inclination of the wafer exist. To avoid this, the conventional projection exposure apparatus also includes a mechanism (auto-leveling mechanism) for detecting and controlling a horizontal position of the wafer at each exposure position, as well as the aforementioned auto-focus mechanism. An example of combination of these two mechanisms is disclosed in U.S. Pat. No. 4,558,949 which shows integral combination of a level detection system of oblique incident collimater type and a focus detection system of oblique incident type.

In recent years, in order to manufacture ICs having higher integration, there is a strong tendency that the wavelength of exposure light is shortened, thereby obtaining the high resolution. To this end, for example, it has been proposed that KrF excimer laser beam (wave length $\lambda=248.5$ nm) is used as the exposure light. In case of a projection exposure apparatus using the KrF excimer laser beam, even when alignment between the reticle and the wafer is performed by a TTL (through the lens) system wherein alignment light having wavelength different from that of the exposure light is illuminated on the substrate through an exposure projection lens, such apparatus has no light source for emitting alignment light having appropriate wavelength near that of the exposure light. Thus, the wavelength of the exposure light greatly differs from that of the alignment light. Since the projection lens is so designed as to reduce or eliminate color aberration with respect to the particular wavelength of the exposure light, it is difficult to provide an alignment optical system in which the color aberration is properly corrected.

Further, even when the alignment is performed by using the excimer laser beam itself, there are many problems to be solved. For example, a problem that the photosensitive material such as photoresist coated on the wafer is exposed, and a problem regarding wide dispersion in output pulse from the excimer laser which itself is a pulsating light source must be solved. Therefore, in a projection exposure apparatus using a deep-ultraviolet radiation source, it is effective to provide an alignment sensor of off-axis type spaced apart from the projection optical system by a predetermined distance and adapted to exclusively detect alignment marks on the wafer, since, when the alignment sensor of off-axis type is used, there is substantially no limitation regarding the wavelength of the alignment light and the way of detection thereof, with the result that alignment having high reproductivity can be expected.

However, in the projection exposure apparatus having the conventional alignment sensor of off-axis type, the auto-focusing and auto-leveling are performed only at the exposure position (exposure field of the projection optical system). In this case, if the positional deviation of the imaging plane of the projection optical system occurs due to the fluctuation of the atmospheric pressure or the like, the best focus position of the alignment sensor of off-axis type do not change correspondingly. Therefore, even when the exposure plane of the wafer is aligned with the imaging plane of the projection optical system by means of the auto-focus system, out-of-focus occurs in the alignment sensor of off-axis type, thereby worsening the accuracy for detecting the alignment marks on the wafer.

Further, when the exposure continues for a long time, the position of the imaging plane of the projection optical system may be changed along the optical axis by the thermal deformation due to the continuous illumination of the exposure light. Also in this case, since the best focus position of the alignment sensor of off-axis type does not change, when the exposure plane of the wafer is aligned with the imaging plane of the projection optical system, out-of-focus will occur in the alignment sensor of off-axis type.

Furthermore, if the surface of the wafer is inclined, when the alignment mark is detected by the alignment sensor of off-axis type in a condition that the surface of the wafer is aligned with the imaging plane of the projection optical system at the exposure position of the projection optical system, the surface of the wafer is deviated from the focus of the alignment sensor at a detection position where the alignment sensor is provided and, therefore, the detection accuracy will be worsened. Incidentally, if the alignment mark is shifted to the exposure position of the projection optical system and then the surface of the wafer is aligned with the imaging plane of the projection optical system by the auto-focus action and then the alignment mark is shifted to the detection position where the alignment sensor is provided, the alignment mark will be brought to the best focus position and, therefore, the optimum accuracy will be obtained. In this case, however, since a stage must be shifted from the exposure position to the alignment mark position (corresponding to the position where the alignment sensor is provided), throughput will be deteriorated.

In the manufacturing process for manufacturing various devices, the exposure procedures for photo-lithography are repeated. In many cases, the projection patters are different from each other each time. The pattern image projected in this case must have a predetermined positional relation to the previous pattern image on the substrate. The predetermined positional relation between the reticle and the substrate is referred to as "alignment" and the accuracy of such positional relation is referred to as "alignment accuracy". In any cases, the imaging feature of the projection optical system such as the projection magnification (reduction ratio) and/or distortion is often adjusted in the subsequent exposure process. The adjustment of the imaging feature can be achieved by using a method for adjusting the imaging feature to a predetermined imaging feature or a method for adjusting the imaging feature in consideration of a shape of the shot area on the photosensitive substrate. In the former method, the imaging feature is adjusted each time when a predetermined time period is elapsed or each time when a predetermined number of photosensitive substrates are treated. In the latter method, the imaging feature is adjusted by measuring the shape of the shot area on each photosensitive substrate and then by adapting the imaging feature to the measured shape. However, in the latter method, the photosensitive substrate may often be expanded, contracted or distorted during the treatment processes such as heat treatment and/or ion injection. If such expansion or the like occurs, the pattern images cannot be completely overlapped through the whole area under the same reduction ratio and/or distortion. When the shape of the shot area on the photosensitive substrate is changed between lots (each lot being a treatment unit for a predetermined number of photosensitive substrates), the imaging feature may be adjusted only regarding the first photosensitive substrate in each lot.

By adjusting the imaging feature in this way, the imaging plane of the projection optical system is displaced along the optical axis direction (Z-direction). Thus, the adjusting amount of the imaging feature and the displaced amount of the imaging plane are previously considered and a correspondence table representing the correspondence between the adjusting amount and the displaced amount is previously prepared. After the adjustment, when the exposure is effected, the position of the displaced imaging plane is predicted on the basis of the correspondence table, and the photosensitive substrate is aligned with the predicted position. The reason is that, if the correct position of the imaging plane is detected by using a reference member each time when the imaging feature is adjusted, a long time will be taken and the through-put of the device will be worsened.

In order to increase an amount of information treated by micro-devices, finer patterns have been requested. However, when the finer pattern images are aligned with each other by using the conventional steppers, it has been found that the good quality rate of the devices was reduced. It is considered that the main reason is that the alignment accuracy is poor.

When the imaging feature of the projection optical system is adjusted, the imaging plane of the projection optical system is displaced along the optical axis direction to be offset from the focusing plane of the alignment system. As a result, although the depth of focus of the alignment system is great, the imaging plane becomes in a significant defocus (out of focus) condition. That is to say, the detection accuracy is greatly decreased. Thus, if the mark is detected under the defocus condition, output of the detection signal will be also decreased. Particularly, in case of a mark from which a signal is hard to be emitted, reduction in output of the detection signal is great, resulting in the reduction in detection accuracy. On the other hand, if the mark is detected under the defocus condition, the detection accuracy will be decreased due to telecentric error (inclination of the optical axis) of the alignment system. However, these problems need not be considered in the conventional techniques. Strictly speaking, the alignment is incorrect more or less, and, thus, the alignment accuracy is low. However, in the past, since the patterns were not so fine, even when the alignment accuracy was low, the good quality rate of the devices was high. When the pattern becomes finer, the low alignment accuracy causes the quality of the devices to worsen, thereby reducing the good quality rate of the devices.

One way for solving the above-mentioned problems is to perform the focusing not only in a projection optical system but also in an alignment detecting system for a substrate. The present invention is directed to an effective method for effecting the focusing in the alignment detecting system for the substrate. However, even when the focusing in the alignment detecting system for the substrate is performed accurately, if a distance (baseline) between the exposure center of the mask pattern and the center of the substrate alignment detecting system is not measured correctly, it is not possible to determine the correct position of the exposure position on the substrate with respect to the mask. Thus, an apparatus for correctly measuring the baseline in a short time has been greatly requested.

SUMMARY OF THE INVENTION

An object of the present invention is to provide a projection exposure apparatus having an alignment sensor of off-axis type wherein a position of an alignment mark on a wafer can be detected by the alignment sensor with high accuracy regardless of the fluctuation of focus of a projection lens of a projection optical system and a pattern image on a reticle can be projected onto an exposure plane of a wafer with high resolving power by means of the projection optical system.

Another object of the present invention is to provide a projection exposure apparatus having an alignment sensor of off-axis type wherein, even if a surface of a wafer is inclined, a position of an alignment mark can be detected by the alignment sensor with high accuracy without worsening throughput.

Further object of the invention is to provide methods for detecting positioning marks in the foregoing apparatuses.

The present invention can be applied to a projection exposure apparatus comprising a projection optical system for projecting a pattern of a mask onto each of exposure areas on a photosensitive substrate, a substrate stage for positioning the substrate in a plane perpendicular to an optical axis of the projection optical system, a mark detection system of off-axis type spaced apart from the projection optical system by a predetermined distance, a control system for aligning each exposure area on the substrate with the mask on the basis of a detected position of a positioning mark formed on the substrate detected by the mark detection system by means of the stage, a height adjusting means for positioning the substrate in a direction parallel to the optical axis of the projection optical system, and a focus position detection means for detecting a focus position of the substrate along the direction parallel to the optical axis of the projection optical system in the proximity of the optical axis of the projection optical system.

According to an embodiment of the present invention, the projection exposure apparatus further comprises an environmental condition measuring means for measuring an environmental condition to which the projection optical system and the mark detection system of off-axis type belong, and the control system includes an offset calculating means which serves to determine an offset amount of the imaging position of the projection optical system and an offset amount of a best focus position of the mark detection system on the basis of the detection result of a change amount of the environmental condition. In this embodiment, focus positions which are to be detected by the focus position detection means are independently changed on the basis of the offset amount obtained by the offset calculating means when the position of the positioning mark on the substrate is detected by the mark detection system and on the basis of the offset amount obtained by the offset calculating means when the pattern of the mask is exposed on each of the exposure areas on the substrate via the projection optical system, respectively, whereby the positions on the substrate which are parallel with the optical axis of the projection optical system are independently set by the height adjusting means, respectively.

According to another embodiment of the present invention, the projection exposure apparatus further comprises an inclination amount measuring means for measuring an inclination amount of the substrate rested on the substrate stage with respect to a plane perpendicular to the optical axis of the projection optical system, and the control system includes a calculating means for calculating a shifting amount of the height adjusting means required to correct a distance between the mark and the mark detection system to a predetermined value on the basis of the focus position at any position on the substrate determined by the focus position detection means, the inclination amount of the substrate determined by the inclination amount measuring means and arrangement information regarding the marks on the substrate, when the stage is positioned so that the mark can be detected by the mark detection system.

According to a further embodiment of the present invention, the projection exposure apparatus further comprises an inclination amount measuring means for measuring an inclination amount of the substrate rested on the substrate stage with respect to a plane perpendicular to the optical axis of the projection optical system, and a substrate inclination amount correction means provided on the substrate stage and adapted to incline the substrate, and the control system serves to cause the substrate inclination amount correction means to correct so that the substrate becomes perpendicular to the optical axis of the projection optical system on the basis of the inclination amount determined by the inclination amount measuring means, to cause the focus position detection means and the height adjusting means to shift the substrate upwardly or downwardly so that a distance between the mark and the mark detection system has a predetermined value, and then to cause the mark detection system to detect the position of the positioning mark, when the stage is positioned so that the mark can be detected by the mark detection system.

According to a still further embodiment of the present invention, the projection exposure apparatus further comprises an inclination amount measuring means for measuring an inclination amount of the substrate rested on the substrate stage with respect to a plane perpendicular to the optical axis of the projection optical system, and a comparison means for comparing the inclination amount of the substrate determined by the inclination amount measuring means with a previously stored allowable value of the inclination amount of the substrate, and the control system serves to control the focus position detection means and the height adjusting means so that a distance between the mark and the mark detection system has a predetermined value, if it is judged that the inclination amount of the substrate determined by the inclination amount measuring means is greater than the allowable value, when the stage is positioned so that the mark can be detected by the mark detection system.

According to another aspect of the present invention, there is provided an exposure method comprising the steps of (1) adjusting a projection optical system for projecting a pattern of a mask onto a photosensitive substrate so as to bring an imaging feature of the projection optical system to a predetermined imaging feature, (2) positioning a surface of the substrate on a focusing plane of an off-axis alignment system, (3) positioning an alignment mark on the substrate at a mark detecting position of the alignment system by shifting a shiftable stage on which the substrate is rested in a plane perpendicular to an optical axis of the projection optical system, and for detecting a position of the alignment mark at that mark detecting position, (4) shifting a predetermined shot area on the substrate to a position immediately below the projection optical system by shifting the shiftable stage in the plane perpendicular to the optical axis of the projection optical system on the basis of a detected value, (5) positioning a surface of the predetermined shot area on an imaging plane, and (6) projecting and exposing the pattern onto the substrate.

A projection exposure apparatus used for carrying out the above method comprises a stepper including a projection optical system for projecting a pattern of a mask onto a photosensitive substrate, a shiftable stage on which the substrate is rested and which can be shifted in a plane perpendicular to an optical axis of the projection optical system, and an off-axis alignment system disposed adjacent to the projection optical system and adapted to detect a mark position of an alignment mark on the substrate, and wherein a position of a positioning mark formed on the substrate is detected by the alignment system and the shiftable stage is shifted on the basis of the position of the mark detected by the alignment system to effect exposure, the stepper further including an auto-focus portion for shifting the substrate along a direction of the optical axis of the projection optical system to bring a surface of the substrate to a predetermined position, an imaging feature adjusting portion for adjusting an image of a pattern projected on the substrate to a predetermined condition, a calculation portion for outputting a difference $\Delta Za$ between an imaging plane of the projection optical system and a focusing plane of the alignment system, on the basis of an adjusted amount effected by the adjusting portion, and a control portion for adjusting the auto-focus portion on the basis of the difference $\Delta Za$ to position the surface of the substrate on the focusing plane.

According to a further aspect of the present invention, there is provided an exposure method comprising the steps of (1) adjusting a projection optical system for projecting a pattern of a mask onto a photosensitive substrate so as to bring an imaging feature of the projection optical system to a predetermined imaging feature, (2) positioning a surface of the substrate on an imaging plane of the projection optical system, (3) positioning a mark on the substrate at a mark detecting position of an off-axis alignment system by shifting a shiftable stage on which the substrate is rested in a plane perpendicular to an optical axis of the projection optical system, and for detecting a position of the alignment mark at that mark detecting position, (4) calculating a deviation amount $\Delta X$ of the detected mark position on the basis of a difference $\Delta Za$ between an imaging plane of the projection optical system and a focusing plane of the alignment system in an optical axis direction, (5) correcting a detection value obtained in the step (3) by adding the deviation amount $\Delta X$ to the detection value, and shifting a predetermined shot area on the substrate to a position immediately below the projection optical system by shifting the shiftable stage in the plane perpendicular to the optical axis of the projection optical system on the basis of the corrected detection value, and (6) projecting and exposing the pattern onto the substrate.

A projection exposure apparatus used for carrying out this method comprises a stepper including a projection optical system for projecting a pattern of a mask onto a photosensitive substrate, a shiftable stage on which the substrate is rested and which can be shifted in a plane perpendicular to an optical axis of the projection optical system, and an off-axis alignment system disposed adjacent to the projection optical system and adapted to detect a mark position of an alignment mark on the substrate, and wherein a position of a positioning mark formed on the substrate is detected by the alignment system and the shiftable stage is shifted on the basis of the position of the mark detected by the alignment system to effect exposure, the stepper further including an auto-focus portion for shifting the substrate along a direction of the optical axis of the projection optical system to bring a surface of the substrate to an imaging plane of the projection optical system, an imaging feature adjusting portion for adjusting an image of a pattern projected on the substrate to a predetermined condition, a calculation portion for outputting a difference $\Delta Za$ between the adjusted imaging plane and a focusing plane of the alignment system, and a correction portion for calculating a deviation amount $\Delta X$ of the mark position on the basis of the difference $\Delta Za$ and correcting a detection value of the mark position on the basis of the deviation amount $\Delta X$.

According to a still further aspect of the present invention, there is provided a projection exposure apparatus comprising a projection optical system for projecting a pattern image formed on a mask on a photosensitive substrate, a substrate stage for shifting the photosensitive substrate in a plane perpendicular to an optical axis of the projection optical system, a reference pattern member which is shifted together with the photosensitive substrate by means of the substrate stage and on which first and second reference marks are formed, a substrate alignment detecting system for measuring the position of an alignment mark formed on the photosensitive substrate, and a mask alignment detecting system for measuring a relative positional relation between an alignment mark formed on the mask and the first reference mark formed on the reference pattern member through the projection optical system. In this apparatus, a relative positional relation between the mask and the substrate alignment detecting system is determined by measuring a position of the second reference mark by means of the substrate alignment detecting system while measuring positional deviation of the mask with respect to the first reference mark by means of the mask alignment detecting system, and the reference pattern member is tiltable.

BRIEF DESCRIPTION OF THE DRAWINGS

FIG. 4(a) is a schematic illustration showing wafer marks and index marks observed by an imaging element, and FIG. 4(b) is a wave graph showing imaging signals corresponding to the marks of FIG. 4(a);

DETAILED DESCRIPTION

Now, a projection exposure apparatus according to a preferred embodiment of the present invention will be explained with reference to the accompanying drawings. In this embodiment, the present invention is applied to a projection exposure apparatus wherein a pattern image of a reticle is successively projected on each of shot areas of a wafer on which photoresist (resist) material is coated, by a step-and-repeat process.

Figure 1:
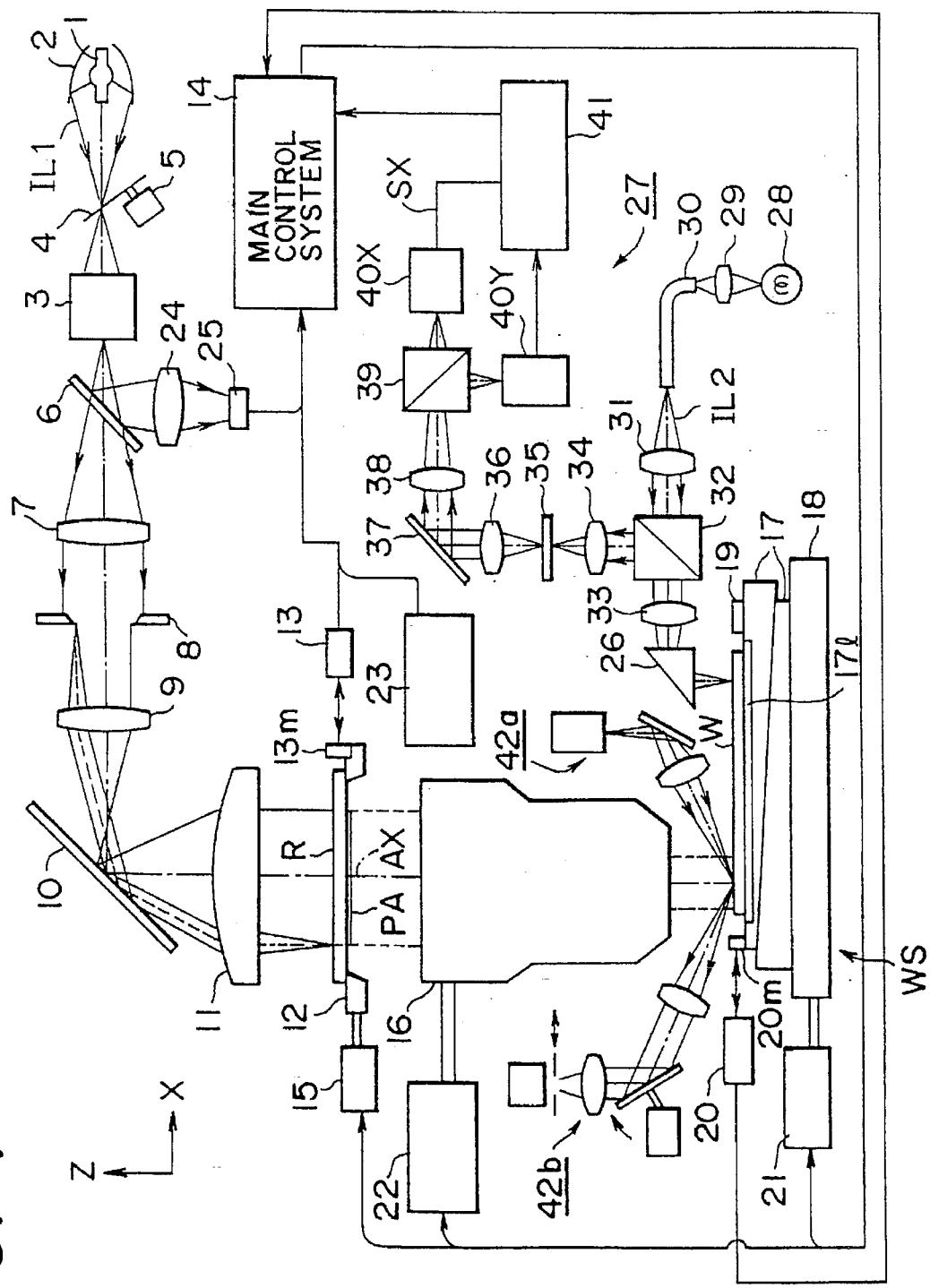
FIG. 1 is a schematic illustration showing a projection exposure apparatus according to a preferred embodiment of the present invention.

FIG. 1 shows a schematic construction of the projection exposure apparatus according to this embodiment. In FIG. 1, exposing light IL1 emitted from a super-high pressure mercury lamp 1 is reflected by an elliptical mirror 2 to be focused on a second focal point of the elliptical mirror and then is incident to an illuminating optical system 3 including a collimater lens, an interference filter, an optical integrator (fly eye lens), an aperture stop (σ stop) and the like. Further, in the proximity of the second focal point of the elliptical mirror 2, there is arranged a shutter (for example, four-bane rotary shutter) 4 driven by a motor 5 to close or open a light path for the exposing light IL1. Incidentally, the exposing light IL1 is not limited to bright-line (i-line and the like) emitted from the mercury lamp 1, but may be a laser beam emitted from a KrF excimer laser or an ArF excimer laser, or high harmonic wave emitted from a metal vapor laser or a YAG laser.

Almost all of the exposing light IL1 outcoming from the illuminating optical system 3 and having a wavelength in the range for sensitizing a resist layer of the wafer passes through a beam spritter 6 and then passes through a first relay lens 7, a variable field stop (reticle blind) 8 and a second relay lens 9 to reach a mirror 10. Then, the light is reflected by the mirror to be directed downwardly in a vertical direction toward a main condenser lens 11. Then, the light passes through the main condenser lens to illuminate a pattern area PA of a reticle R with substantially uniform illuminance. A plane on which the reticle blind 8 is positioned is conjugate with (in an imaging relation to) a pattern forming plane of the reticle R.

The reticle R can be shifted minutely in a direction of an optical axis of a projection optical system 16 by a motor 15 and is rested on a reticle stage 12 which can be shifted two-dimensionally and rotated minutely in a horizontal plane which is perpendicular to the optical axis. A shiftable mirror 13m is secured to one end of the reticle stage 12, which mirror can reflect a laser beam from a laser light wave interference measuring machine (interferometer) 13, so that a two-dimensional position (X-Y directions) of the reticle stage 12 is always detected by the interferometer 13, for example, with a resolving power of the order of 0.01 µm. Reticle alignment systems (not shown) arranged on the reticle R serve to detect two sets of alignment marks formed on a peripheral portion of the reticle R. By shifting the reticle stage 12 minutely on the basis of detection signals from the reticle alignment systems, the reticle R is positioned so that a center of the pattern area PA is aligned with the optical axis AX of the projection optical system.

The exposing light IL1 passing through the pattern area PA of the reticle R is incident to the telecentric projection optical system 16, with the result that a projected image of the circuit pattern of the reticle R is reduced by ⅕ of its original size, and the reduced image is projected (focused) on one of shot areas formed on a wafer W on which a photoresist layer is formed. The wafer is held so that a surface of the wafer coincides with the imaging plane of the projection optical system 16.

Figure 3:
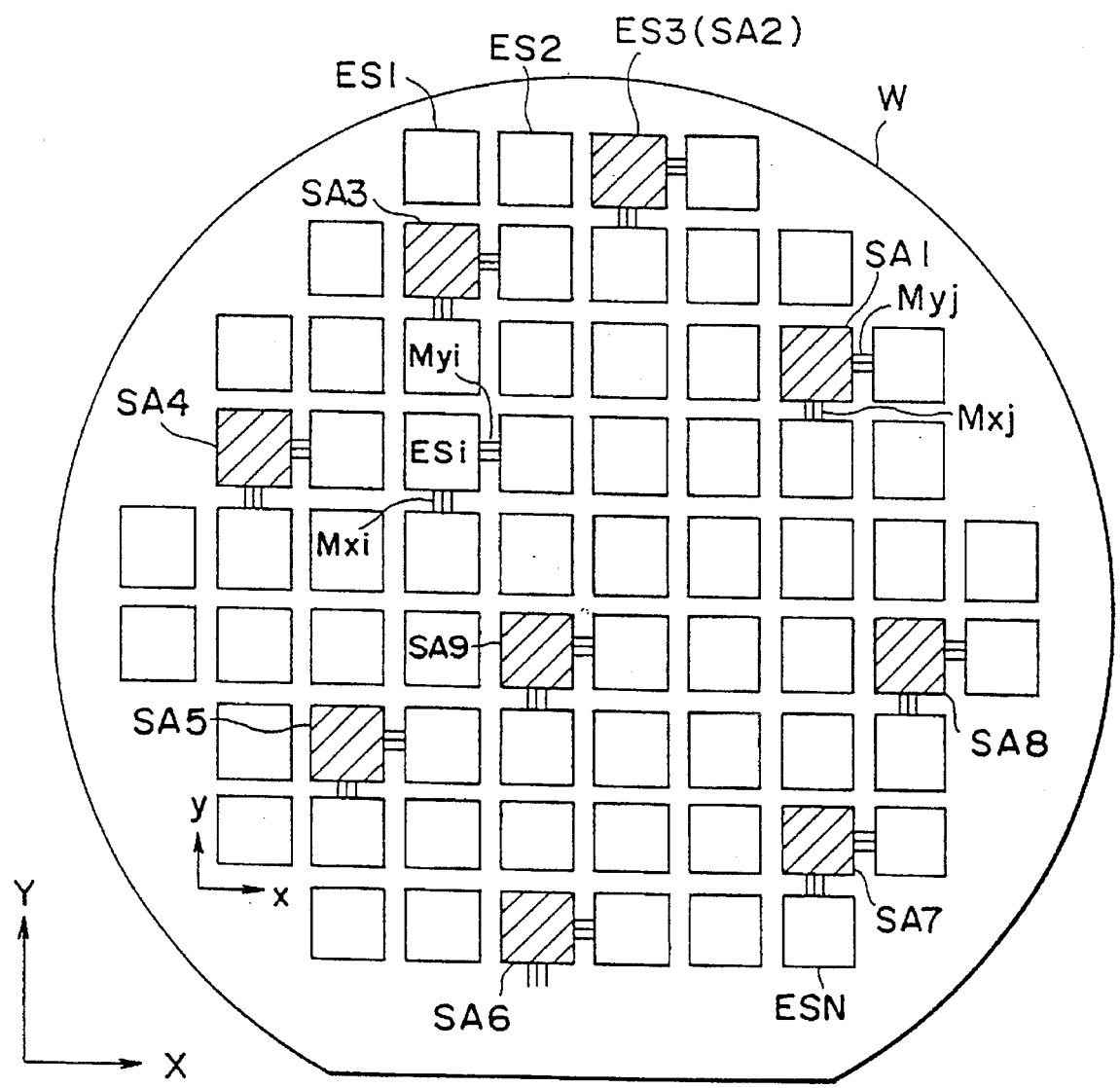
FIG. 3 is a plan view showing an arrangement of shot areas on a wafer to be exposed, according to the above-mentioned embodiment.

FIG. 3 shows the shot areas ES1–ESN arranged on the wafer W along coordinates system (x, y) of the wafer W. An X-direction alignment wafer mark Mxi and a Y-direction alignment wafer mark Myi are formed on street lines adjacent to each shot area ESi. The wafer mark Mxi is a mark of multi bar type consisting of a plurality of bars arranged along the X-direction at a predetermined pitch, and the wafer mark Myi is a mark of multi bar type consisting of a plurality of bars arranged along the Y-direction at a predetermined pitch. Further, in the illustrated embodiment, for example, the alignment is performed by an enhanced global alignment system (referred to as "EGA system" hereinafter). The EGA system is a known system in which the positions of the wafer marks regarding only shot areas SA1–SA9 (for example) preselected among all of the shot areas SAi are detected by an alignment sensor of off-axis type. These areas are called "sample shot areas". Then, design coordinates applicable to all of the shot areas are calculated by treating the detection results statistically and the alignment regarding the other shot areas is effected on the basis of the calculated design coordinates. The EGA system is explained in U.S. Pat. No. 4,780,617.

Returning to FIG. 1, the wafer W is stuck to a minutely rotatable wafer holder (not shown) by a vacuum action and is rested on a Z stage 17 via the wafer holder, and the Z stage 17 is rested on an XY stage 18. A main control system 14 for controlling an operation of the entire apparatus serves to drive the XY stage 18 by a motor 21 in a step-and-repeat manner, and also operate the Z stage 17, thereby shifting the wafer two-dimensionally and positioning the wafer W in a Z direction parallel with the optical axis of the projection optical system 16 via the Z stage 17. A leveling stage 17l for leveling the wafer W horizontally is incorporated in the Z stage 17. When transfer exposure of the reticle R regarding one shot area on the wafer W is finished, the wafer W is steppingly shifted to a next shot position by the XY stage 18 of the wafer stage WS. A shiftable mirror 20m for reflecting a laser beam from an interferometer 20 is secured to one end of the Z stage 17, so that a two-dimensional position of the Z stage 17 is always detected by the interferometer 20, for example, with a resolving power of the order of 0.01 µm.

Further, a reference member 19 consisting of a glass substrate on which a reference mark used in base line measurement is formed is provided on the Z stage 17 so that an upper surface of the reference member is substantially flush with the exposure surface of the wafer W. The term "substantially" is used in front of "flush" since the height of the upper surface may be different among wafers or among shot areas in a wafer. In the illustrated embodiment, while a position of the reference member is changed in the Z-direction by the Z stage 17, the reference mark is observed by an alignment sensor of off-axis type 27 (described later), whereby a best focus position of the alignment sensor 27 is determined from a position where the contrast of the imaged reference mark becomes highest. The reference mark formed on the reference member 19 may be a mark of multi bar type, similar to the wafer marks.

Further, by detecting the position of the reference mark on the reference member 19 by means of the alignment sensor 27 and then by detecting the position of the reference mark by means of an observation system (not shown) of TTL (though the lens) type through the projection optical system 16, a base line amount, i.e., a deviation amount between the optical axis of the projection optical system 16 and an optical axis of the alignment sensor 27 is determined. By detecting the position of any wafer mark on the wafer by means of the alignment sensor 27 and by adding the base line amount to the detection result, it is possible to determine the position of the shot area to which such wafer mark belongs in the exposure field of the projection optical system 16.

A light emitting mark (comprising a light source and a slit) is provided on the reference member 19. Light from the light emitting mark is projected onto the reticle R through the projection optical system 16, and then, the reflected light from the reticle is detected by a light receiving sensor disposed adjacent to the light emitting mark. The Z stage 17 is shifted in the Z direction to a position where the detection amount of the light receiving sensor becomes maximum. This position corresponds to an imaging plane of the projection optical system 16. On the other hand, the light from the light emitting mark is projected onto the reticle alignment mark, and then, the reflected light from the mark is detected. A distance (distance in the primary or basic XY coordinates) between a center of the reticle and the reticle alignment mark is measured by scanning the reticle alignment mark by shifting the light emitting mark in the XY directions. By comparing the measured value with the actual distance between the center of the reticle and the reticle alignment mark, the imaging feature of the projection optical system 16 can be calculated.

In assembling the stepper, a focusing plane of the alignment sensor 27 and the imaging plane of the projection optical system are in substantially the same horizontal plane. However, in use, the positional relation between the focusing plane and the imaging plane is changed due to change in atmospheric pressure and/or heat generated by exposure.

Furthermore, as shown in FIG. 1, there is provided an imaging feature correction portion 22 for adjusting an imaging feature of the projection optical system 16. The correction portion 22 according to the illustrated embodiment serves to correct the imaging feature (for example, projection magnification and/or distortion) of the projection optical system 16 by independently driving some of lens elements constituting the projection optical system 16 (particularly, a plurality of lens elements arranged in the proximity of the reticle R) by means of a piezoelectric element and the like to move them (in a direction parallel with the optical axis AX or incline them with respect to the optical axis). In this regard, the imaging feature of the projection optical system 16 includes the position of the imaging plane (focusing position) which is also changed in accordance with environmental pressure and temperature, and illuminating time of the exposing light regarding the projection optical system 16 (more specifically, heat accumulating amount of the projection optical system regarding absorption of the exposing light). Similarly, the best focus position of the alignment sensor 27 is changed depending upon the atmospheric pressure and temperature.

In consideration of the above, an environment sensor 23 is provided at an intermediate position between the projection optical system 16 and the alignment sensor 27, so that the atmospheric pressure and temperature are always measured by the environment sensor 23 to send the measured result to the main control system 14. The main control system 14 serves to determine the change in the imaging feature of the projection optical system 16 and the amount of change in the position of the imaging plane based on an equation known through tests and at the same time determine the amount of change of the best focus position of the alignment sensor 27. Regarding the change in the imaging feature of projection optical system 16 other than the position of the imaging plane, such change is corrected by the main control system 14 via the imaging feature correction portion 22. Further, regarding the change in the position of the imaging plane of the projection optical system 16 and the change in the best focus position of the alignment sensor 27, the main control system 14 deals with such changes by independently setting the focus position of the wafer W via the Z stage 17 during the exposure operation and during the alignment operation, respectively, which will be described later.

On the other hand, the exposing light IL1 reflected by the beam spritter 6 is incident to a photoelectric detector 25 via a collective lens 24, and a photoelectric conversion signal from the photoelectric detector 25 is sent to the main control system 14. Since a relation between a light receiving amount of the photoelectric detector 25 and exposure energy on the exposure plane of the wafer W is previously determined, the main control system 14 can monitor an integrated exposure amount regarding each shot area of the wafer W by integrating the photoelectric conversion signals from the photoelectric detector 25, thereby controlling an exposure time. At the same time, since the total integrated light amount of the exposing light passing through the projection optical system 16 can be determined from the integrated exposure amount, the main control system 14 can determine the amount of change in the imaging feature of the projection optical system 16 and the changed amount of change in the position of the imaging plane of the projection optical system 16 on the basis of the integrated result of the photoelectric conversion signals from the photoelectric detector 25 and perform the correction in the manner as mentioned above.

The projection exposure apparatus according to the illustrated embodiment further comprises a focus position detection system (referred to as "AF sensor" hereinafter) for measuring the position of the exposure plane of the wafer W. The auto-focusing is effected by the AF sensor, Z stage 17 and main control system 14 in a conventional manner. As shown in FIG. 1, the AF sensor is constituted by a light sending system 42a and a light receiving system 42b which are arranged on both sides of the projection optical system 16.

Figure 2:
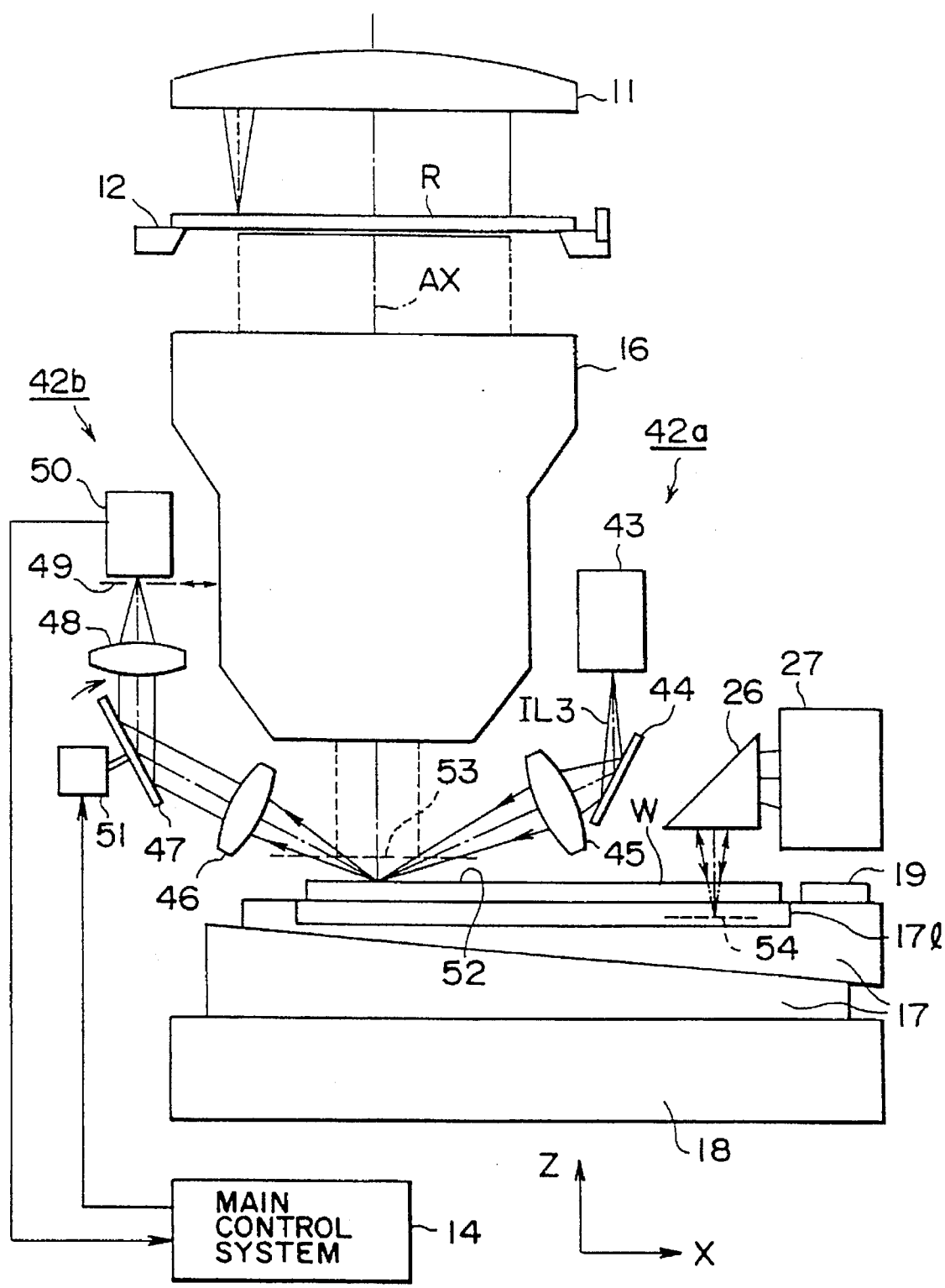
FIG. 2 is an enlarged view showing an AF sensor of FIG. 1.

FIG. 2 is an enlarged view of the AF sensor. In FIG. 2, the AF sensor comprises the light sending system 42a (illuminating system 43—light receiving objective lens 45) and the light receiving system 42b (light receiving objective lens 46—photoelectric detector 50). In the light sending system 42a, an aperture plate (not shown) having a slit is disposed in front of the illuminating system 43. Detection light (for example, light non-sensitive to the photoresist on the wafer W) IL3 passing through the aperture is incident to the exposure plane of the wafer W (or the surface of the reference member 19) via a mirror 44 and the light receiving objective lens 45 obliquely with respect to the optical axis AX of the projection optical system 16, with the result that a slit image is focused and projected on the exposure plane. The detection light reflected by the exposure plane is incident to a light receiving surface of the photoelectric detector 50 through the light receiving objective lens 46, inclination angle adjustable mirror 47, focusing lens 48 and vibration slit plate 49, so that the slit image is re-focused on a slit aperture on the light receiving surface of the photoelectric detector. The light passing through the aperture is photoelectrically converted into a detection signal, and a synchronous relation of the detection signal with respect to a drive signal (reference signal) for the vibration slit plate 49 is determined in the main control system 14, thereby obtaining a focus signal.

In this case, a longitudinal direction of the slit image projected on the exposure plane of the wafer W corresponds to a direction normal to the plane of FIG. 2. Thus, when the exposure plane of the wafer W is displaced in the Z-direction, the slit image focused on the light receiving surface of the photoelectric detector 50 is shifted in the X-direction. Accordingly, since the focus signal emitted from the photoelectric detector 50 is substantially linearly changed in proportion to the deviation amount that the exposure plane of the wafer W is deviated from the focus position within a predetermined range, the deviation amount of the exposure plane of the wafer W from the focus position can be detected on the basis of the focus signal. Further, by rotating the mirror 47 of the light receiving system 42b around an axis normal to the plane of FIG. 2, the slit image focused on the light receiving surface of the photoelectric detector 50 can be shifted in the X-direction. The inclination angle of the mirror 47 is set by the main control system 14 via a drive portion 51. As will be described later, when the position of the best imaging plane of the projection optical system 16 in the Z-direction (position of the imaging plane) is determined, the center of the slit image is aligned with the center of the aperture on the light receiving surface of the photoelectric detector 50 by inclining the mirror 47, for example, in a condition that the exposure plane of the wafer W is set at the position of the imaging plane. This means that the focus signal is set at a zero-cross point. In this way, calibration of the AF sensor is effected.

Further, as shown in FIG. 1, a prism mirror 26 and the above-mentioned alignment sensor 27 are arranged at one side of the projection optical system 16. In the alignment sensor 27, illuminating light IL2 emitted from a halogen lamp 28 is incident to an optical fiber 30 through a collective lens 29, and the illuminating light IL2 outcoming from the other end of the optical fiber 30 is incident to the prism mirror 26 through a lens system 31, half prism 32 and objective lens 33, with the result that the illuminating light reflected by the prism mirror 26 illuminates or lights the wafer mark on the wafer W substantially vertically.

Light reflected by the wafer mark on the wafer W advances reversely to reach the half prism 32 through the prism mirror 26 and objective lens 33. Light reflected by the half prism 32 focuses the wafer mark image on an index plate 35 through a focusing lens 34. X-direction index marks 35a, 35b (refer to FIG. 4) and Y-direction index marks are formed on the index plate 35. As shown in FIG. 4, each of the index marks 35a, 35b is constituted by two bar patterns which extend toward a direction corresponding to the Y-direction and which are spaced apart from each other by a predetermined distance in a direction corresponding to the X-direction.

In FIG. 1, the index plate 35 is arranged in a conjugate relation to the wafer W in a portion of an optical system comprised of the objective lens 33 and focusing lens 34. Accordingly, the wafer mark image on the wafer W is focused or imaged on the index plate 35, and the light from the index plate 35 reaches image pick-up surfaces of image pick-up elements (camera elements) 40X, 40Y each of which comprises a two-dimensional CCD camera and the like, through a relay system 36, mirror 37, relay system 38 and half prism 39. The wafer mark image and the index mark image are focused on the image pick-up surfaces of the image pick-up elements 40X, 40Y, respectively. As a result, a signal treatment system 41 detects positional deviation between the index marks on the index plate 35 and the wafer mark on the basis of image pick-up signals from the image pick-up elements 40X, 40Y, and the positional deviation amount is inputted to the main control system 14. In this case, a scanning direction of the image pick-up element 40X is a direction corresponding to the X-direction and a scanning direction of the image pick-up element 40Y is a direction corresponding to the Y-direction. The detection of the position of the X-direction wafer mark Mxi in FIG. 3 is effected on the basis of the image pick-up signal from the image pick-up element 40X, and the detection of the position of the Y-direction wafer mark Myi is effected on the basis of the image pick-up signal from the image pick-up element 40Y. The reason for using the index marks in this way is that a scan start position from which the image scanning is started by the image pick-up elements 40X, 40Y is drifted.

Although not shown in FIG. 1, an illumination field stop is provided in such a manner that the field stop is substantially conjugate with the wafer W in the lens system 31. The field stop serves to regulate an illumination area on the wafer W. When the X-direction wafer mark Mxj associated with the sample shot area SA1 shown in FIG. 3 is positioned immediately below the half prism 26, a condition of a portion corresponding to the illumination area observed by the image pick-up element 40X of FIG. 1 is shown in FIG. 4(a). The illumination area 55 on the wafer W comprises an area 55c corresponding to the wafer mark Mxj, and areas 55a, 55b substantially corresponding to the index marks 35a, 35b on the index plate 35 in the proximity of the wafer mark Mxj. The reason why the illumination area 55 also includes the areas 55a, 55b is that the index marks 35a, 35b on the index plate 35 can be illuminated permeably by utilizing the light returned from the wafer.

Accordingly, in order to prevent noise components from other marks and/or circuit patterns from mixing with the light illuminating the index marks 35a, 35b, the areas 55a, 55b have no circuit pattern and no mark and are normally mirror-finished. Hereinbelow, any area having no circuit pattern and no mark such as the areas 55a, 55b is referred to as a "forbidden zone".

The image pick-up signal SX from the image pick-up element 40X, which corresponds to the wafer mark Mxj and the index marks 35a, 35b in this case is shown in FIG. 4(b). Here, the coordinate indicates intensity of the signal and the abscissa indicates the scanning position of the XY stage 18 of FIG. 1 in the X-direction. As shown in FIG. 4(b), the image pick-up signal from the image pick-up element 40X has a signal wave which has "bottoms" (lowest levels) at positions corresponding to edges of the index marks 35a, 35b and the wafer mark Mxj. Further, wafer alignment marks and index marks are also provided with respect to the Y-direction, which marks are detected by the image pick-up element 40Y.

Next, an exposing method in this embodiment will be explained. For example, in consideration of the atmospheric pressure alone, the apparatus is previously adjusted in such a manner that the position of the imaging plane of the projection optical system 16 is aligned with the best focus position of the alignment sensor 27 at given reference atmospheric pressure, and the calibration is previously effected so that the focus signal from the AF sensor takes a zero-cross point. Before the exposure on the wafer W is performed, the main control system 14 of FIG. 1 causes the environment sensor 23 to measure the atmospheric pressure to which the projection optical system 16 and the alignment sensor 27 are subjected, and the amount of change $\Delta Z1$ of the position of the imaging plane of the projection optical system 16 and the amount of change $\Delta Z2$ of the best focus position of the alignment sensor 27 are calculated on the basis of a difference between the measured atmospheric pressure and the reference atmospheric pressure.

As shown in FIG. 2, if the calibration is effected so that the focus signal from the AF sensor shows the zero-cross feature curve when the exposure plane of the wafer W is positioned at a reference plane (imaging plane of the projection optical system in a reference condition) 52, the imaging plane of the projection optical system 16 will be lifted up to a plane 53 for example, due to the change in the atmospheric pressure, and the best focus position of the alignment sensor 27 is lowered up to a plane 54 for example. As mentioned above, the amount of change $\Delta Z1$ from the reference plane 52 to the plane 53 and the amount of change $\Delta Z2$ from the reference plane 52 to the plane 54 are calculated by the main control system 14.

Figure 5A:
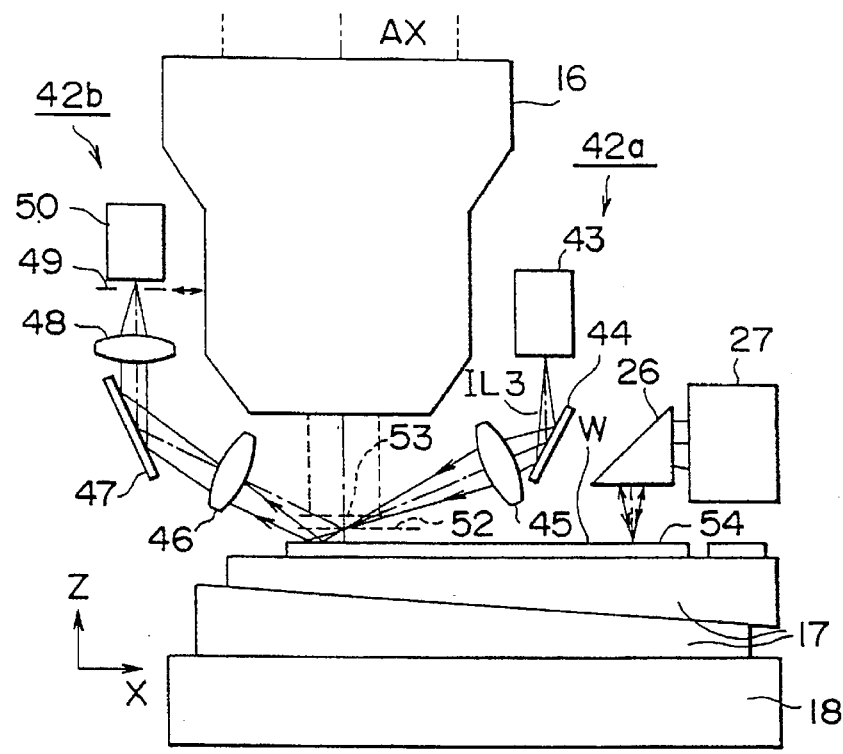
FIG. 5A is a side view of a main portion of the apparatus showing a focus position in an alignment operation.

Now, when the positions of the wafer marks of the sample shot areas (sample shot areas SA1–SA9 in FIG. 4) on the wafer W are detected by using the alignment sensor 27, the main control system 14 causes the drive portion 51 to incline the mirror 47 by an angle corresponding to the amount of change $\Delta Z2$ of the best focus position. In this condition, when the auto-focus is activated, as shown in FIG. 5A, a plane where the focus signal obtained from the light receiving system 42b of the AF sensor shows the zero-cross curve is aligned with the plane 54 which corresponds to the best focus position of the alignment sensor 27. Accordingly, by activating the auto-focus, the surface of the wafer W is shifted to the plane 54. In this condition, by detecting the position of each wafer mark by using the alignment sensor 27, the position of the wafer mark can be detected with high accuracy.

In the illustrated embodiment, as mentioned above, the detection of the positions of the wafer marks is performed with respect to the shot areas SA1–SA9 only. On the basis of the positions of the shot areas SA1–SA9 determined in this way, a coordinate system having minimum error in identifying the positions of all of the shot areas including the other shot areas is calculated or determined by the main control system 14 based on the EGA system. Thereafter, the respective shot areas are successively shifted to the exposure area by the action of the XY stage 18 based on the relationship between the design and calculated coordinate systems and the exposing is performed each time.

The main control system 14 has an offset calculation to determine the total amount of the change in focus positions ($\Delta Z1-\Delta Z2$).

Figure 5B:
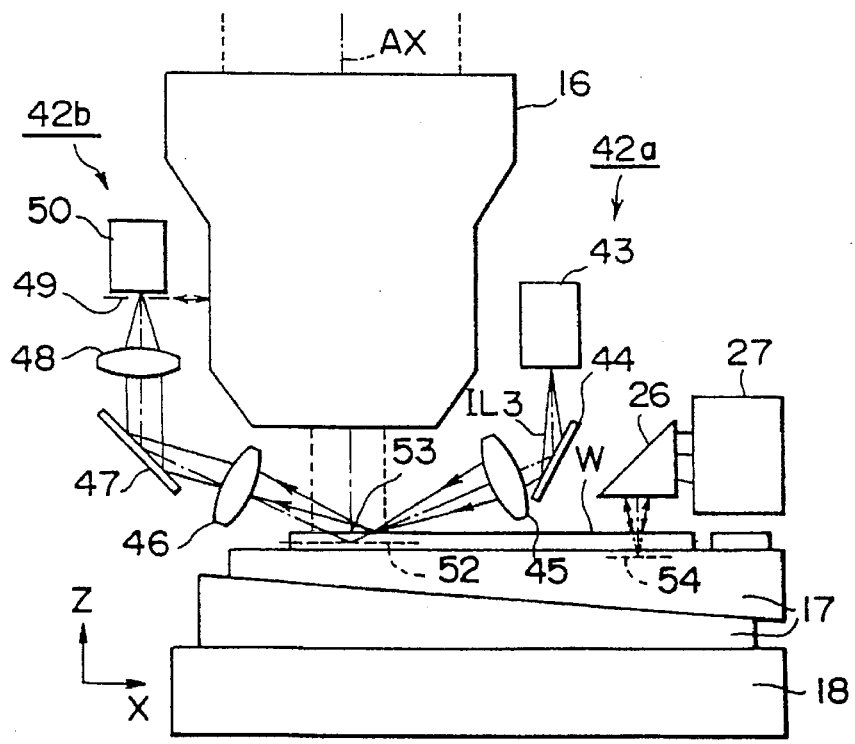
FIG. 5B is a side view of a main portion of the apparatus showing a focus position in an exposure operation.

When the exposing is performed regarding each shot area on the wafer, the main control system 14 of FIG. 2 causes the drive portion 51 to incline the mirror 47 by an angle corresponding to the amount of change ($\Delta Z1-\Delta Z2$) of the focus position. In this condition, when the auto-focus is activated, as shown in FIG. 5B, the plane where the focus signal obtained from the light receiving system 42b of the AF sensor shows the zero-cross curve is aligned with the plane 53 corresponding to the imaging plane of the projection optical system 16. In this condition, by performing the exposing, the pattern of the reticle R can be projected on each shot area of the wafer W with high resolving power.

Incidentally, if the amount of change $\Delta Z1$ of the position of the imaging plane and the amount of change $\Delta Z2$ of the best focus position are small, it may be judged that good focus will be obtained in such a situation that the focus signal is deviated from the zero-cross condition by taking advantage of a linear portion of the focus signal, and such amount of deviation may be set as different values in the mark measuring operation and in the exposing operation. Alternatively, the main control system 14 may be adapted to given an electric offset to the output of the AF sensor based on the value ($\Delta Z1-\Delta Z2$).

Further, for example, the calibration regarding the position of the imaging plane of the projection optical system 16 can be performed by using a test print or a light emitting mark formed on the stage supporting the wafer, and the calibration regarding the best focus position of the alignment sensor 27 can be performed by observing the reference mark on the reference plate 19. When it is found as a result of the calibration that an offset amount ($\Delta Z3$) is to be added to the focus position, the offset amount $\Delta Z3$ must be added to the above-mentioned amounts of change $\Delta Z1$, $\Delta Z2$. However, if the offset amount $\Delta Z3$ influences upon not only the positional fluctuation of the imaging plane of the projection optical system 16 but also the fluctuation of the best focus position of the alignment sensor 27, by previously adjusting the reference plane of the AF sensor by the offset amount $\Delta Z3$, such offset amount $\Delta Z3$ is automatically taken into account when the best focus position of the alignment sensor 27 is determined.

By correcting the focus position as mentioned above, the alignment can be performed, by using the AF sensor of the projection optical system 16 so that the exposure plane of the wafer W is set at the best focus position of the alignment sensor 27 of off-axis type. When the focus position of a single wafer is once determined prior to the alignment process, the further determination of the focus position of that wafer is not required. Even in this case, since the unevenness of the exposure plane of the wafer is usually included within the depth of focus of the alignment sensor 27, reduction of the throughput can be prevented.

Figure 6:
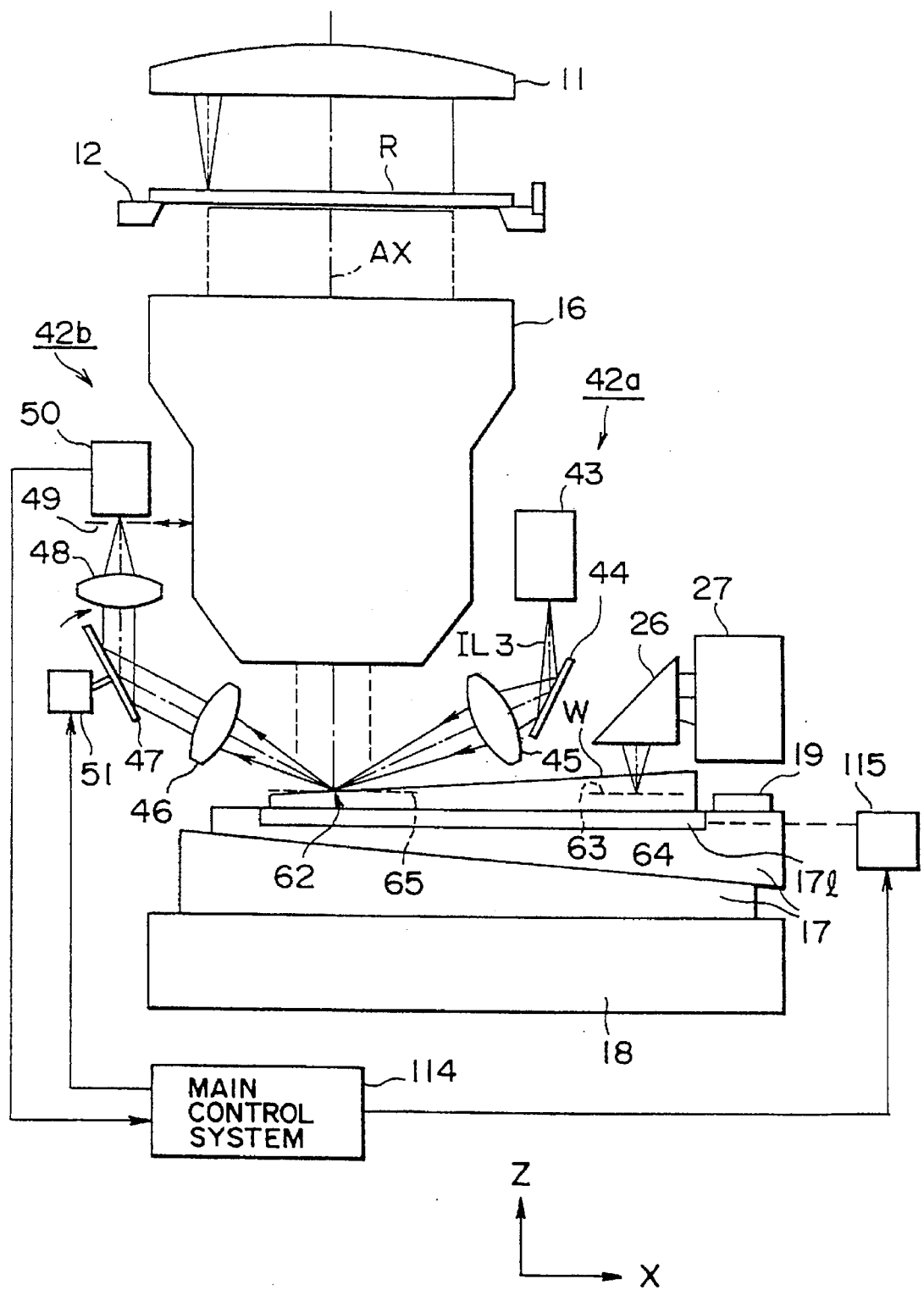
FIG. 6 is a schematic illustration showing a projection exposure apparatus according to another embodiment of the present invention.

FIG. 6 shows a second embodiment of the present invention. In FIG. 6, the same elements as those of the aforementioned first embodiment are designated by the same reference numerals and explanation thereof will be omitted. Hereinbelow, only differences between the first embodiment and the second embodiment will be explained.

In the second embodiment shown in FIG. 6, a main control system 114 has an additional function for storing the measured focus value, a position on the XY coordinates where the measurement of the focus is performed, and an allowable value of the inclination amount used to judge whether the inclination of the wafer W should be corrected or not, as well as the functions that the first embodiment possesses.

If the surface of the wafer is inclined, even when the surface of the wafer is aligned with the best focus position 65 at a focus measuring position 62 of the projection optical system 16, since the surface of the wafer does not coincide with the best focus position 63 at a mark detecting position 64 of the alignment sensor 27, there arises error in the mark detection. The second embodiment can eliminate such error.

In the normal alignment sequence, after search alignment for positioning the wafer with respect to the predetermined XY coordinates of the apparatus with rough accuracy of the order of $\pm 2$ μm by detecting the mark positions of three shot areas (search shots) is performed, fine alignment for detecting the position of each of the shot areas with high accuracy of the order of $\pm 0.1$ μm is effected. In this case, according to the second embodiment, prior to the search alignment, the focus positions of several (three or more) points on the wafer W are determined by the AF sensor, and the inclination amount of the wafer W in the Z-direction (parallel with the optical axis AX of the projection optical system 16) is calculated by using the least square method and the like on the basis of the determined focus positions and the positions of such several points (at which the focus positions are determined) on the XY coordinates.

The focus measuring positions for determining the inclination amount of the wafer W may be any three points on the wafer W. Thus, for example, the focusing may be effected at a center of each of three shot areas used for the search alignment, or at the mark position (Mxi or Myi) of each search shot.

When the search alignment and/or the fine alignment are performed, on the basis of the XY coordinates position of the alignment mark to be detected, the measured inclination amount and the focus positions determined during the measurement of the inclination amount, the main control system 114 calculates the shifting amount of the Z stage so that the alignment mark is positioned in the proximity of the best focus position when such alignment mark is brought below the alignment sensor 27, and the mark position is detected after shifting the Z stage accordingly in a vertical direction based on this calculation.

Alternatively, the focusing may be performed at the alignment mark positions to effect the mark position detection during the search alignment, while the inclination amount of the wafer is determined at the same time on the basis of the measured focus positions, and the mark position may be detected by shifting the Z stage in accordance with the determined inclination amount in the vertical direction during the fine alignment.

Further, when the shot area where the focusing was previously performed at the mark position is included in the fine alignment shot areas, the focus position of such shot area may be previously stored, and the mark position regarding such shot area may be detected by shifting the Z stage to the stored focus position (without shifting the Z stage in accordance with the inclination amount of the wafer).

Next, a third embodiment of the present invention will be explained. In this third embodiment, a leveling stage drive device 115 shown in FIG. 6 is used. Regarding the method for measuring the inclination amount of the wafer W, similar to the second embodiment, prior to the search alignment, the focus positions of several (three or more) points on the wafer W are determined by the AF sensor, and the inclination amount of the wafer W in the Z-direction (parallel with the optical axis AX of the projection optical system 16) is calculated by using the least square method and the like on the basis of the determined focus positions and the positions of such several points (at which the focus positions are determined) on the XY coordinates. The main control system 114 activates the drive device 115 to eliminate the calculated inclination. When the focus at any positions on the wafer W was once aligned with the best focus position of the alignment sensor 27 before the mark position detection is performed, the mark position detection can be performed without effecting the focusing prior to the detection of the marks of all of shot areas during the alignment operation. The inclination amount of the wafer may be calculated on the basis of the focus positions measured during the search alignment, and such inclination amount may be eliminated by performing the leveling prior to the fine alignment. Alternatively, the focus positions may be first measured at three shot areas used for the search alignment and the inclination amount of the wafer may be calculated, and then, after the leveling is effected, the search alignment may be performed.

After the inclination is eliminated, by shifting the Z stage vertically up to the best focus position of the alignment sensor 27, the wafer which is now in a flat condition can be aligned with the best focus position of the alignment sensor 27, so that the mark positions can be detected without performing the focusing regarding all of the alignment marks.

When the surface of the wafer is to be aligned with the best focus position of the alignment sensor 27, if the best focus plane of the alignment sensor 27 differs from the best focus plane of the projection optical system 16, the focusing operation may be performed after the inclination angle adjustable mirror 47 of the AF sensor is inclined so that after the focusing the wafer W can be shifted to the best focus plane of the alignment sensor 27 in the Z-direction. Alternatively, the surface of the wafer W may be previously aligned with the best focus plane of the projection optical system 16 and then the Z stage may be shifted vertically by a distance corresponding to the difference between the previously determined best focus plane of the alignment sensor 27 and the best focus plane of the projection optical system 16. In any case, it will be sufficient if the exposure plane of the wafer W can be shifted to the best focus plane of the alignment sensor 27 by utilizing the AF sensor.

Next, a fourth embodiment of the present invention will be explained. Similar to the second and third embodiments, in order to measure the inclination amount of the wafer W, prior to the search alignment, the focus positions of several (three or more) points on the wafer W are determined by the AF sensor, and the inclination amount of the wafer W in the Z-direction (parallel with the optical axis AX of the projection optical system 16) is calculated by using the least square method and the like on the basis of the determined focus positions and the positions of such several points (at which the focus positions are determined) on the XY coordinates.

If the inclination amount is greater than a predetermined set value stored in the main control system 114, the mark position detection is performed in a respective shot area focus mode in which the focusing is effected regarding all of the shot areas which are to be position-detected for the alignment; whereas, if the inclination amount is smaller than the set value, the mark position detection is performed in a non-focus mode in which the individual focusing is not effected in the mark position detection. In the non-focus mode, the focus positions may be detected again regarding shot areas positioned in the proximity of the center of the wafer W or the Z stage may be shifted to the focus position of the shot area which is lastly focused, or the Z stage may be shifted to an average focus position. In the respective shot area focus mode, when the shot area where the focusing was previously performed is included in the fine alignment shot area, the focusing data of such shot area may be previously stored, and the mark position regarding such shot area may be detected by using such data. In place of the inclination of the wafer, a range of the movement of the Z stage (positional fluctuation in the surface of the wafer along the Z-direction) may be obtained to judge the inclination amount. The set values as references for judging the inclination and the range of the Z stage movement can be determined in the light of the telecentricity of the sensor or the required accuracy.

The function of this forth embodiment can be applied to the aforementioned second embodiment and/or third embodiment. In this case, regarding the second embodiment, if the inclination amount is greater than the set value, the Z stage is shifted vertically so that the mark position is aligned with the best focus position of the alignment sensor 27; whereas, if the inclination amount is smaller than the set value, the operation for aligning the mark position with the best focus position of the alignment sensor 27 is not carried out. On the other hand, when the function of the fourth embodiment is applied to the third embodiment, if the inclination amount is greater than the previously stored set value, the inclination is eliminated; whereas, if the inclination amount is smaller than the set value, the mark position detection is performed without eliminating the inclination and without affecting the focusing at respective alignment mark positions.

Next, a fifth embodiment of the present invention will be explained with reference to FIG. 7. Since this fifth embodiment differs from the above-mentioned first embodiment only in the point that an adjusting portion 222 and a main control system 214 differ from those in the first embodiment, the explanation of the same elements will be omitted.

Figure 7:
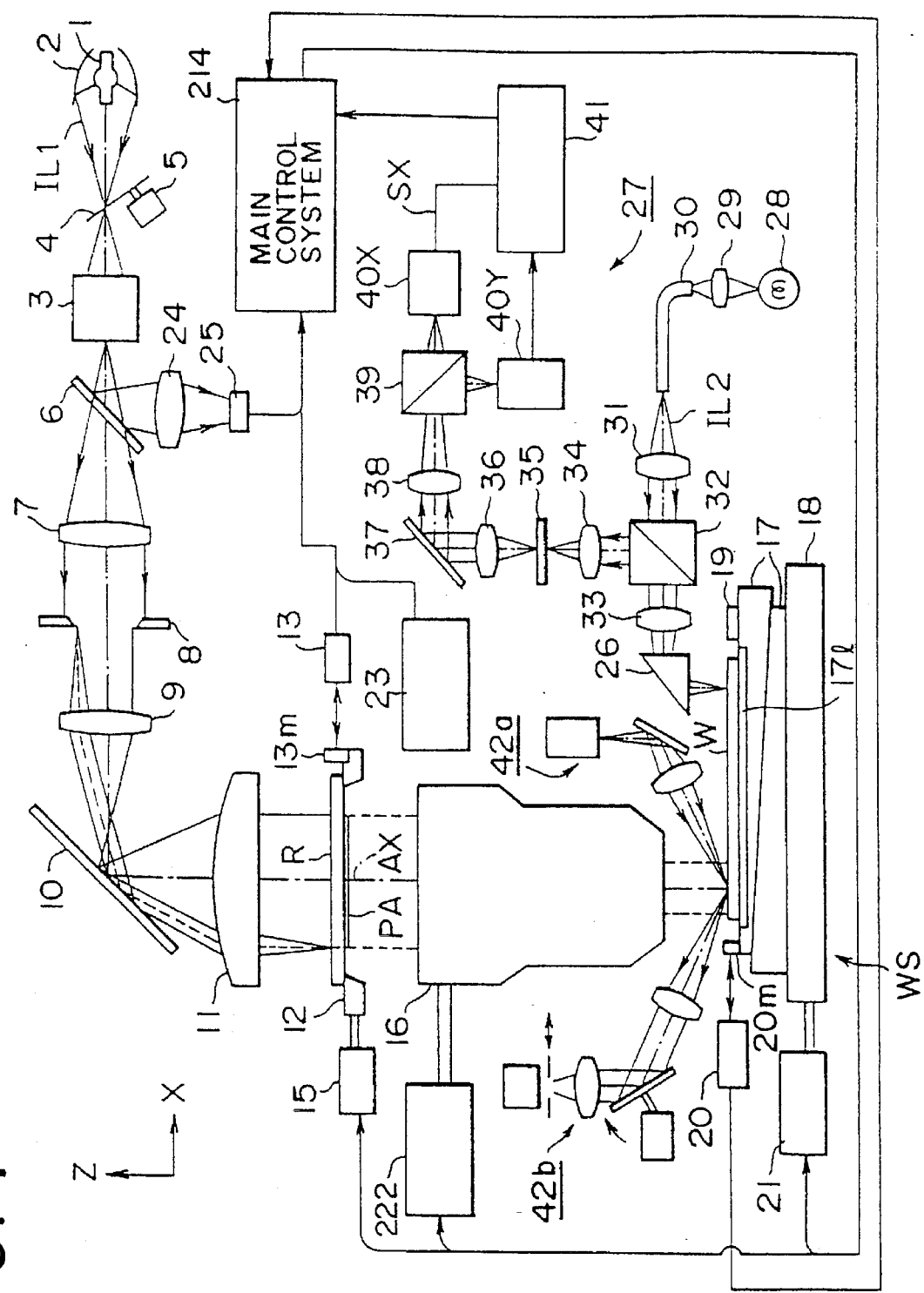
FIG. 7 is a schematic illustration showing a projection exposure apparatus according to a further embodiment of the present invention.

Regarding FIG. 1, while an example that the imaging feature correction portion 22 corrects the imaging features other than the positional change in the imaging plane on the basis of the measured result regarding the atmospheric pressure and temperature was explained, the adjusting portion 222 shown in FIG. 7 is controlled by a command from the main control system 214 to change the imaging features to desired conditions, as well as the above-mentioned correction.

When the imaging features are adjusted by the adjusting portion 222, the position of the imaging plane of the projection optical system is changed accordingly. Consequently, there arises a difference between the imaging plane and the best focus position of the alignment sensor 27.

Thus, the amount of change $\Delta Za2$ of the imaging plane of the projection optical system 16 caused by the adjustment of the imaging features of the projection optical system 16 is previously determined as a function of the adjusting amount, and the determined value is stored in the main control system 214. In addition, a difference $\Delta Za1$ between the best focus position of the alignment sensor 27 and the imaging plane of the projection optical system is also stored in the main control system 214. In this way, a difference $\Delta Za$ (=$\Delta Za1+\Delta Za2$) between the adjusted imaging plane and the best focus position of the alignment sensor 27 can be calculated and outputted.

Now, methods for measuring the imaging feature (particularly, projection magnification) of the projection optical system 16 will be explained. In a first method, test exposure is performed to measure a distance between a center of the exposed shot area and the measuring mark disposed around the shot area. On the basis of the measured result, the imaging feature can be determined by calculation. In a second method, as mentioned above, the reticle alignment mark on the reticle R is scanned by using the light emitted from the light emitting mark provided on the reference member 19. On the basis of the measured result regarding the imaging feature, the imaging feature is adjusted to be a predetermined imaging feature by means of the adjusting portion 222.

In a third method, the scaling value of the wafer W subjected to the exposure by the above-mentioned EGA system is measured. As a result, the expansion/contraction degree (during the pre-treatment process) of the shot area formed on the wafer W can be determined. The imaging feature (particularly, projection magnification) is adjusted in accordance with the expansion/contraction degree to effect the superimposed exposure.

Next, a first exposure method using the stepper of the fifth embodiment will be explained. The difference between the imaging plane of the projection optical system 16 and the focusing plane of the alignment sensor 27 is previously measured as $\Delta Za1$. Now, the calibration is effected at the position of the imaging plane of the projection optical system 16 so that the focus signal of the AF sensor coincides with the zero-cross point.

In case where the imaging features are adjusted by the adjusting portion 222, when it is assumed that the adjusting amount is $\Delta M1$, the amount of change $\Delta Za2$ of the imaging plane determined in accordance with the adjusting amount $\Delta M1$ can be calculated by the main control system 214 on the basis of the following equation:

$$\Delta Za2 = K \times \Delta M1$$

where, K is a proportional coefficient or factor which is previously determined by tests or simulation.

Before adjustment, as shown in FIG. 2, it is assumed that the imaging plane of the projection optical system 16 is in a certain reference plane 52 and the focus signal of the AF sensor coincides with the zero-cross point when the surface of the wafer W is in the reference plane 52. And, after adjustment, it is assumed that the imaging plane of the projection optical system 16 is lifted by the amount of change $\Delta Za2$ to reach a plane 53. In this case, the mirror 47 is inclined by an angle corresponding to the amount of change $\Delta Za2$ by means of the main control system 214 through the drive portion 51 so that the focus signal of the AF sensor coincides with the zero-cross point in this plane 53. On the other hand, it is assumed that the best focus position (focusing plane) of the alignment sensor 27 is in a plane 54 displaced from the reference plane 52 by the amount $\Delta Za1$ (i.e. a plane lowered from the plane 53 by the amount $\Delta Za$ (=$\Delta Za1+\Delta Za2$)).

First of all, the wafer W is rested on the Z stage 17. Then, positions of the alignment marks for the sample shots (SA1–SA9 in FIG. 3) on the wafer W are detected by using the alignment sensor 27. In this case, the mirror 47 is inclined by an angle corresponding to the difference ($\Delta Za1+\Delta Za2$) of the best focus position by means of the main control system 214 through the drive portion 51 so that the focus signal of the AF sensor coincides with the zero-cross point in the focusing plane of the alignment sensor 27. After the center of the wafer W is shifted to a position immediately below the projection optical system 16, when the auto-focus portion is operated, as shown in FIG. 5A, the surface of the wafer W is shifted to the plane 54 which corresponds to the focusing plane of the alignment sensor. In this condition, the alignment mark is shifted to a position immediately below the alignment sensor 27, and then, the position of the alignment mark is detected in the focusing plane of the alignment sensor 27.

The alignment marks regarding all of the sample shots are detected, and the main control system 214 calculates the positions of all of the shot areas on the basis of the detected mark position coordinates by using predetermined equations.

Then, each of the shot area is exposed. In this case, the mirror 47 is inclined to be returned by an angle corresponding to the difference ($\Delta Za1+\Delta Za2$) of the best focus position by means of the main control system 214 through the drive portion 51 (FIG. 2). In this condition, when the auto-focus portion is operated, as shown in FIG. 5B, the position where the focus signal obtained from the light receiving portion 42b of the AF sensor coincides with the zero-cross point corresponds to the plane 53 which is the imaging plane of the projection optical system 16. In this condition, the shot area to be exposed is shifted to the position just below the projection optical system 16, and, then, the auto-focus portion is operated to shift the surface of the wafer W to the imaging plane of the projection optical system 16. When the exposure is effected under these circumstances, the alignment accuracy is high and the resolving power of the projected image (circuit pattern image) is excellent. The shot areas on the wafer W are successively shifted to the position just below the projection optical system 16 and are exposed. Once all of the shot areas have been exposed, the wafer W is replaced with a new one, and the same procedures are repeated.

If the amount of change ($\Delta Za1+\Delta Za2$) between the position of the imaging plane of the projection optical system 16 and that of the focusing plane of the alignment sensor 27 is small, by using a linear portion of the focus signal, the best focus position of the wafer W may be set at different positions which are spaced apart from each other by an amount "$\Delta Za1+\Delta Za2$" and where the detection of the mark position and the exposure are effected, respectively. Alternatively, electric offset may be merely applied to the zero-cross point for the focus signal.

The position of the imaging plane of the projection optical system 16 can be detected, for example, by using the test print or the light emitting mark provided on the reference member 19. The position of the focusing plane of the alignment sensor 27 can be detected by observing the reference mark on the reference member 19. In consequence of detection, if another offset (such as $\Delta Za3$) exists in the best focus position, the offset amount $\Delta Za3$ must be added to the amounts of changes $\Delta Za1$ and $\Delta Za2$. However, if the cause of the offset $\Delta Za3$ influences to change both of the imaging plane of the projection optical system 16 and the focusing plane of the alignment sensor 27, the reference plane of the AF sensor may previously be adjusted by the amount $\Delta Za3$ by means of the main control system 214. By doing so, the offset $\Delta Za3$ may not necessarily be used to determine the focusing plane of the alignment sensor 27.

Figure 8:
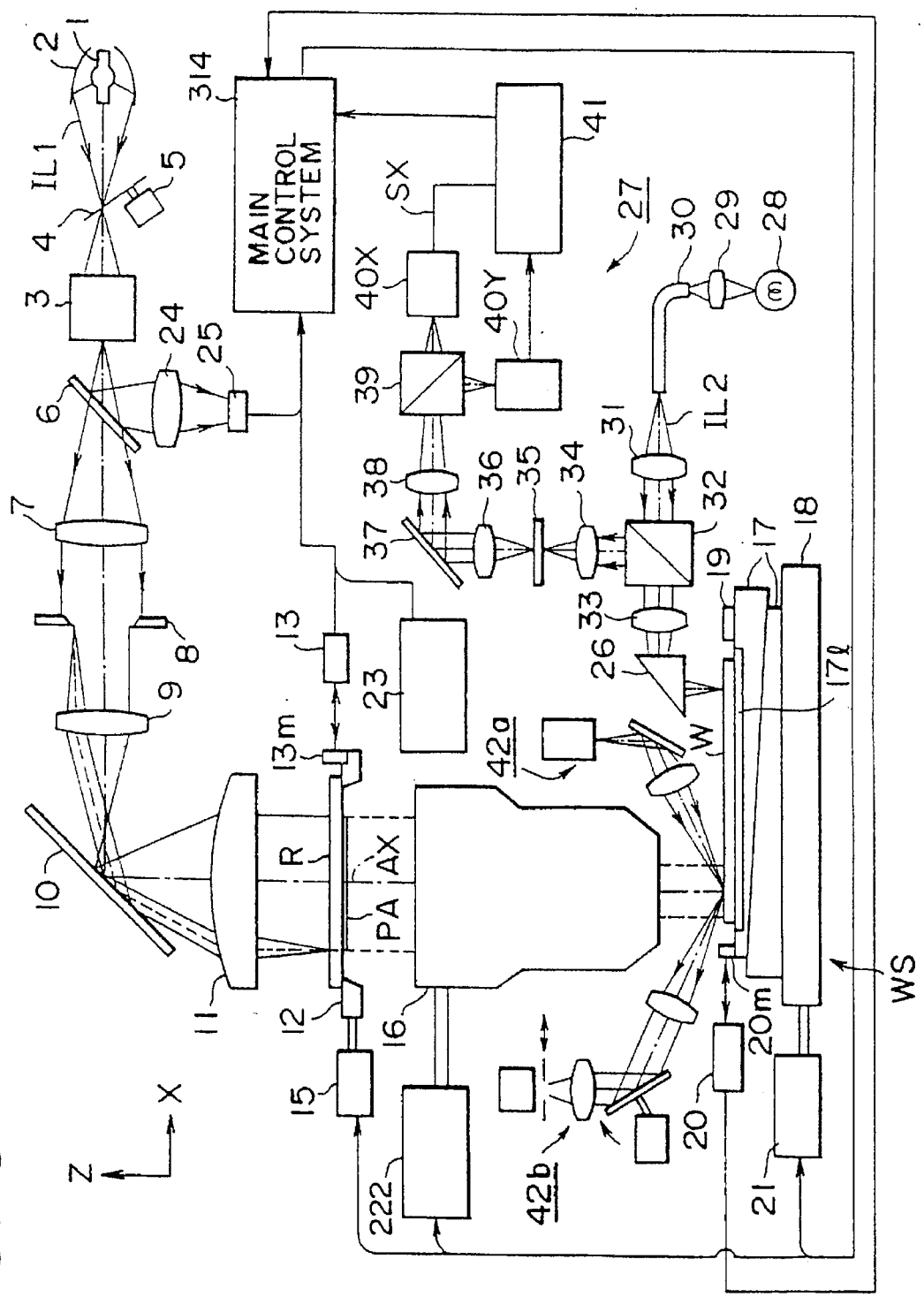
FIG. 8 is a schematic illustration showing a projection exposure apparatus according to a still further embodiment of the present invention.

Next, a sixth embodiment of the present invention will be explained with reference to FIG. 8. This sixth embodiment differs from the above-mentioned fifth embodiment only in the point of a main control system 314. The main control system 314 will be apparent from the following explanation regarding an exposure method.

Now, a stepper according to the sixth embodiment and an exposure method using such a stepper will be described. In this embodiment, the mark position can be correctly detected even if the detection is effected at a position deviated from the focusing plane of the alignment sensor 27.

In the sixth embodiment, the main control system 214 of the fifth embodiment is replaced by a main control system 314 in which an error amount of telecentricity is stored.

After the wafer W is replaced with a new one, a center of the wafer W is shifted to the position just below the projection optical system 16. And, in this condition, the stage is lifted or lowered so that the surface of the wafer W is aligned with the imaging plane of the projection optical system 16. Then, the stage is shifted to bring one of the alignment marks Mxi in the X-direction to the position just below the alignment sensor 27, and, then, the position of the mark is detected. In this case, the detection is effected at a position deviated from the focusing plane of the alignment sensor 27 by an amount ($\Delta Za1+\Delta Za2$) in the Z-direction. In other words, there is an amount of change $\Delta Za$ (=$\Delta Za1+\Delta Za2$) between the imaging plane and the focusing plane. Thus, the detected value is deviated from the actual mark position due to the telecentricity error. In order to correct such deviation, an amount of deviation $\Delta X$ of the detected value is calculated on the basis of the telecentricity error and the amount of change $\Delta Za$ by means of the main control system 314, by referring to the following equation:

$$\Delta X = (Za1+\Delta Za2) \times Tx$$

where, $Tx$ is the telecentricity error in the X-direction. The main control system 314 corrects the mark position by adding the amount of deviation $\Delta X$ to the detected value. The positions of the alignment marks Myi in the Y-direction can similarly be detected and corrected. Thus, the shot arrangement can be determined by detecting several alignment marks in the X-direction and Y-direction. Thereafter, the stage is shifted so that the shot area to be exposed is brought to the position just below the projection optical system 16. Then, the surface of the wafer W is aligned with the best focus position and the exposure is effected. After all of the shot areas are exposed, the wafer W is replaced with a new one, and the same procedures are repeated.

In this embodiment, while an example that the amount of deviation $\Delta X$ is calculated on the basis of the amount of change $\Delta Za$ and the telecentricity error is explained, the calculation of the amount of deviation $\Delta X$ is not limited to such an example, but, any method may be used so long as the amount of deviation is calculated on the basis of the amount of change $\Delta Za$. For example, a relation between the amount of change $\Delta Za$ and the amount of deviation $\Delta X$ may have previously been determined by tests and the like, and such a relation may be stored in the main control system 314.

FIGS. 9 to 13 show a seventh embodiment of the present invention. In this embodiment, there is provided a projection exposure apparatus in which a baseline can be measured without shifting an XY stage greatly and which includes a reference pattern plate having index marks used for alignment of a reticle and a reference mark used for alignment of a wafer. Before the seventh embodiment is explained, in order to facilitate the understanding of the seventh embodiment, a conventional projection exposure apparatus having such a reference pattern plate will be explained with reference to FIG. 14.

Figure 14:
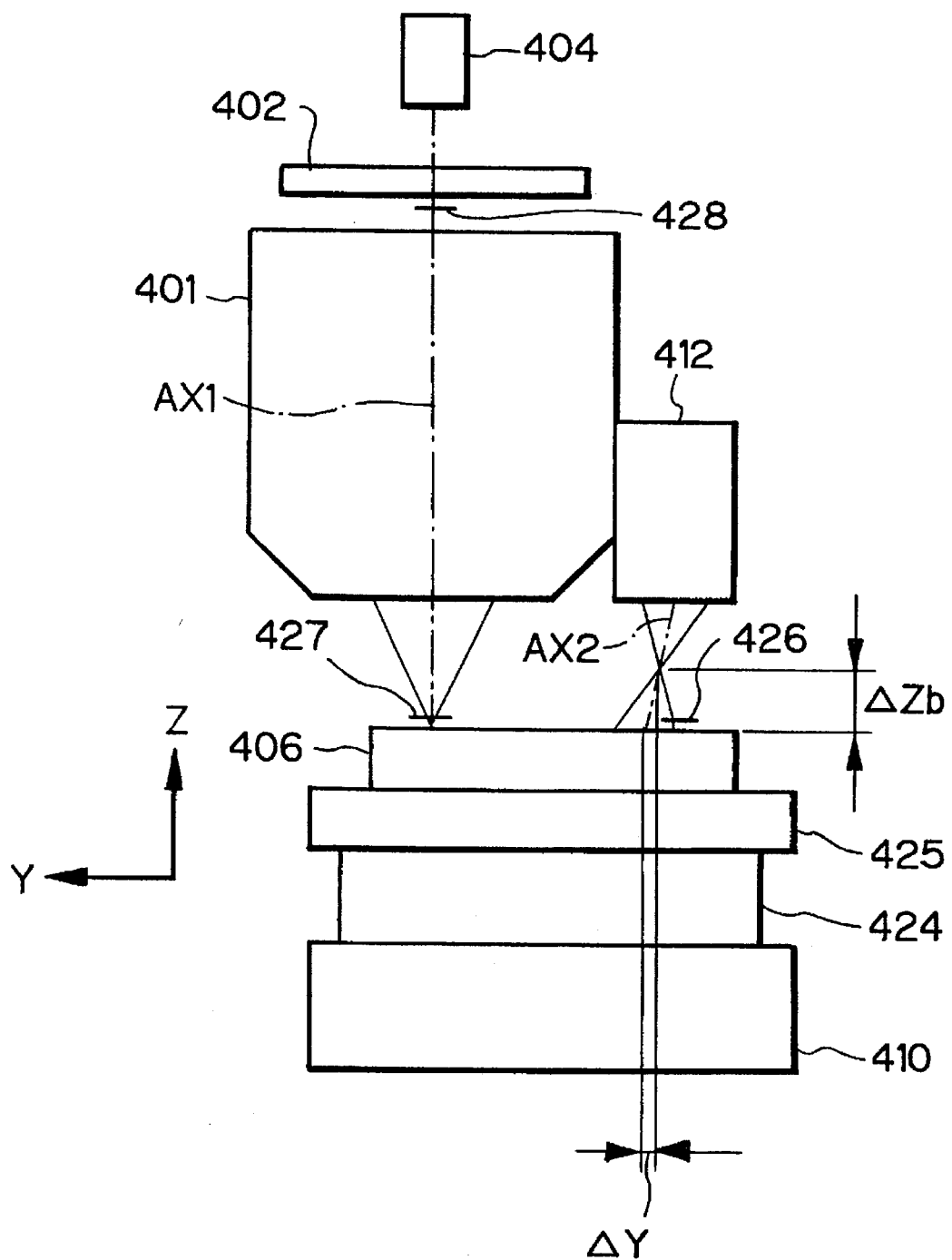
FIG. 14 is a side view showing a condition of a reference pattern plate of a conventional projection exposure apparatus during the measurement of the baseline.

FIG. 14 shows the conventional projection exposure apparatus having an alignment device. In FIG. 14, a reticle 402 is held on a reticle stage (not shown) disposed above a projection optical system 401. A resting plate 425 disposed below the projection optical system 401 is secured to an XY stage 410 via a Z stage 424. The Z axis is selected to be in parallel with an optical axis AX1 of the projection optical system 401, the Y axis is selected to be in parallel with the plane of FIG. 14 and perpendicular to the Z axis, and the X axis is selected to be perpendicular to the plane of FIG. 14. The XY stage 410 serves to shift the resting plate 425 in a direction (X-direction) parallel with the X axis and a Y-direction (parallel with the Y axis), and the Z stage 424 serves to shift the resting plate 425 in a Z-direction (parallel with the Z axis).

As detecting systems of the alignment device, a reticle alignment optical system 404 is provided above the reticle 402, and an off-axis wafer alignment optical system 412 is provided at a side of the projection optical system along the Y-direction. A reference pattern plate (corresponding to a reference pattern plate 406 in FIG. 9 which will be described later) is rested on the resting plate 425 in parallel with a leveling table (not shown), and a wafer as a photosensitive substrate is rested on the leveling table (not shown). An index mark 427 used as a reference for the reticle alignment and a reference mark 426 used as a reference for the wafer alignment are formed on the reference pattern plate 406. For example, the index mark 427 is illuminated by illumination light having the same wavelength as that of the exposure illumination light from the lower side of the reference pattern plate toward the projection optical system 401. An alignment mark 428 is formed on an area (on a pattern surface of the reticle 402) adjacent to original pattern to be transferred and in a viewing field of the reticle alignment optical system 404.

When the XY stage 410 is positioned at a predetermined position, the index mark 427 on the reference pattern plate 406 can be observed by the reticle alignment optical system 404 through the projection optical system 401, and, at the same time, the reference mark 426 can be observed by the wafer alignment optical system 412. In this condition, the positional deviation of the alignment mark 428 with respect to the index mark 427 is detected by the reticle alignment optical system 404 and the positional deviation of the viewing center of the wafer alignment optical system 412 with respect to the reference mark 426 is detected by the wafer alignment optical system 412 itself. In this way, the position of the reticle 402 relative to the reference pattern plate 406 and the position of the wafer alignment optical system 412 relative to the reference pattern plate 406 can be measured simultaneously.

A distance between the index mark 427 and the reference mark 426 has previously been determined. Thus, on the basis of such a distance and the detected positional deviation amounts, a distance (i.e. a so-called baseline) between the exposure center of the pattern on the reticle 402 and the detection center of the wafer alignment optical system 412 can be determined. When the baseline is determined, by driving the XY stage 410 in consideration of coordinate values obtained by correcting the coordinate values of the shot areas on the wafer (measured by the wafer alignment optical system 412) on the basis of the baseline values, each shot area on the wafer can correctly be aligned with the projection position for the reticle pattern.

In the above-mentioned conventional projection exposure apparatus, the baseline of the wafer alignment optical system 412 is measured on the basis of the marks formed on the reference pattern plate 406. However, since the conventional reference pattern plate 406 is secured to the resting plate 425 mounted on the Z stage 424, there arises a problem that an inclination angle of the reference pattern plate cannot be adjusted (although the position of the reference pattern plate along the Z-direction can be adjusted).

Therefore, if there arises the relative positional deviation between the imaging plane of the projection optical system 401 (i.e. best focus plane of the reticle alignment optical system 404) and the best focus plane of the wafer alignment optical system 412 due to the change in the atmospheric pressure and/or thermal load caused by illumination of the exposure illumination light to the projection optical system 401, the surface of the reference pattern plate 406 cannot be aligned with (focused on) the best focus planes of the alignment optical systems 404, 412 simultaneously. As a result, the baseline must be measured under the condition that at least one of the reticle alignment optical system 404 and the wafer alignment optical system 412 is in a defocus position.

In this case, as shown in FIG. 14, for example, if the surface of the reference pattern plate 406 is in a focus position of the reticle alignment optical system 404 but is not in a focus position of the wafer alignment optical system 412 by an amount of $\Delta Zb$, there will arise the following problems. Firstly, contrast of a signal obtained by the wafer alignment optical system 412 is reduced, thereby worsening the re-productivity of measurement. Secondly, if an optical axis AX2 of the wafer alignment optical system 412 is inclined in the YZ plane to worsen the telecentricity, when there is the defocus amount of $\Delta Zb$, measurement error $\Delta Y$ represented by the product the inclination angle and the defocus amount is generated.

The seventh embodiment of the present invention provides a projection exposure apparatus in which both of an alignment optical system for detecting a position of a reticle and an alignment optical system for detecting a position of a wafer can be used under their focused conditions so that a distance (baseline) between the exposure center of a pattern on the reticle and the detection center of the wafer alignment optical system can always be detected correctly.

Now, the projection exposure apparatus according to the seventh embodiment of the present invention will be explained with reference to FIGS. 9 to 13.

Figure 9:
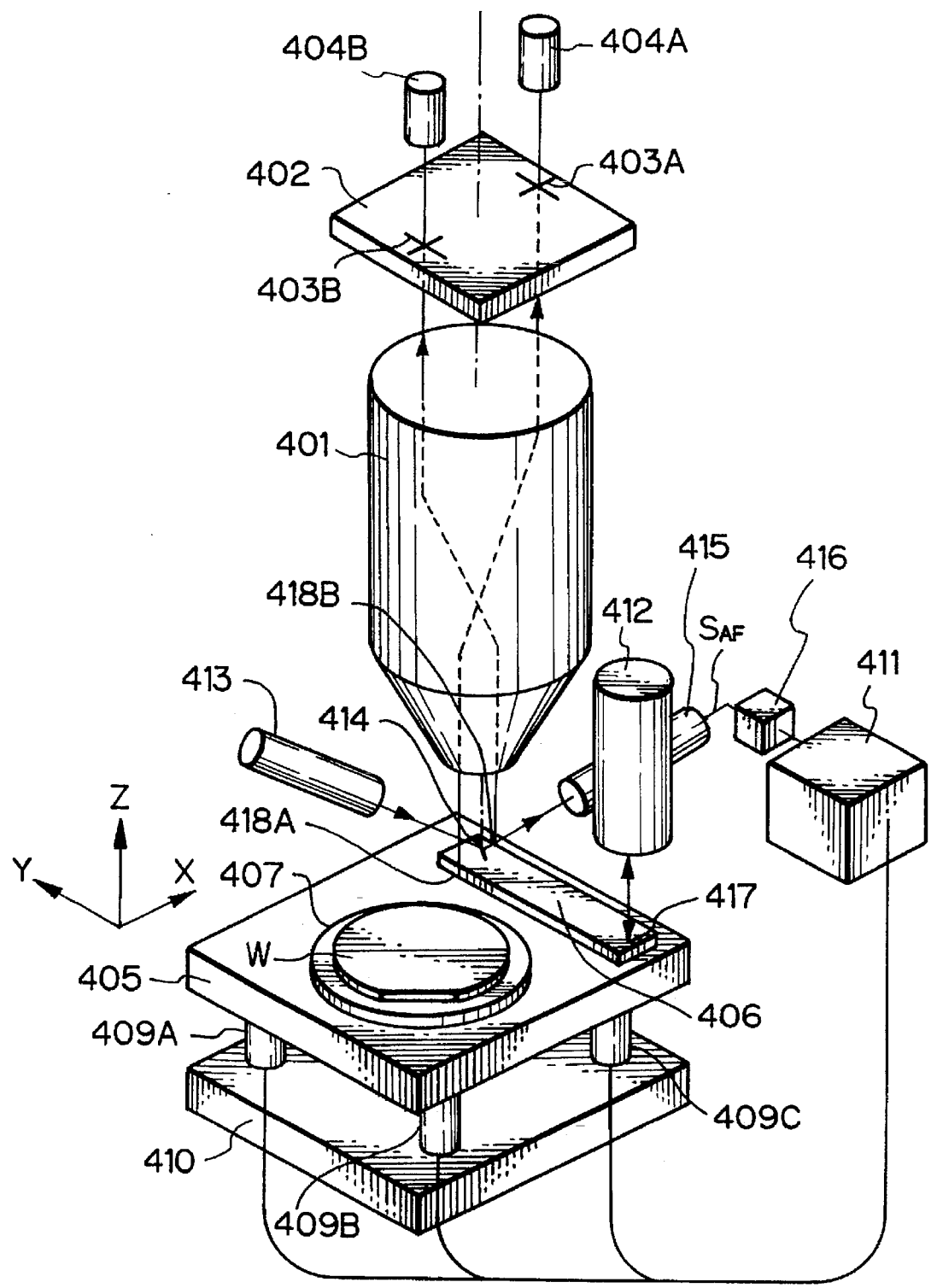
FIG. 9 is a perspective view showing a main portion of a projection exposure apparatus according to a still further embodiment of the present invention.

FIG. 9 shows a main portion of the projection exposure apparatus according to the seventh embodiment. In FIG. 9, a projection optical system 401 is disposed below a reticle 402. Here, the Z axis is selected to be in parallel with the optical axis of the projection optical system 401, and the X axis and the Y axis are represented by an orthogonal coordinate system in a plane perpendicular to the Z axis. Alignment marks 403A, 403B each comprising a crisscross light shield pattern are formed on the reticle 402 on both sides of a pattern area (of the reticle) along a direction (X-direction) parallel with the X axis, and reticle alignment optical systems 404A, 404B are disposed above the alignment marks 403A, 403B, respectively.

On the side conjugate with the reticle 402 of the projection optical system 401, there is provided an XY stage 410 which can be shifted in the direction (X-direction) parallel with the X axis and in the Y-direction, and a Z leveling table 405 is supported on the XY stage 410 via three up/down mechanisms 409A, 409B, 490C for focus adjustment and leveling adjustment. The three up/down mechanisms 409A-409C can be extended and contracted independently in the Z-direction within a predetermined range in response to signals from a main control system 411. With this arrangement, the Z leveling table 405 can be shifted in the Z-direction parallel with the optical axis of the projection optical system 401 and an inclination angle of the Z leveling table 405 can be adjusted finely in the proximity of the imaging plane of the projection optical system 401. Two dimensional coordinate values of the XY stage 410 can be measured by laser interferometers, and the main control system 411 controls the operation of the XY stage 410 on the basis of the measured result.

In the illustrated embodiment, a reference pattern plate 406 and a wafer holder 407 are disposed side by side and are secured on the Z leveling stage 405. When the exposure is performed, a wafer W to be exposed is held on the wafer holder 407 by vacuum. The heights of the reference pattern plate 406 and the wafer holder 407 are so selected that, when the surface of the wafer W is aligned with the imaging plane of the projection optical system 401, the surface of the reference pattern plate 406 is also aligned with its imaging plane. During the exposure, the wafer holder 407 is set in the exposure field of the projection optical system 401 so that the pattern image of the reticle 402 is projected onto one of the shot areas on the wafer W through the projection optical system 401 with the exposure illumination light emitted from an illumination optical system (not shown).

In the illustrated embodiment, a pair of index marks 418A, 418B for the reticle alignment and a reference mark 417 for the wafer alignment are formed on the reference pattern plate 406. During the reticle alignment, the index marks 418A, 418B are illuminated by illumination light having the same wavelength band as that of the exposure illumination light from the lower side of the reference pattern plate toward the projection optical system 401. Further, an off-axis wafer alignment optical system 412 is provided at a side of the projection optical system 401 along the Y-direction.

Figure 10:
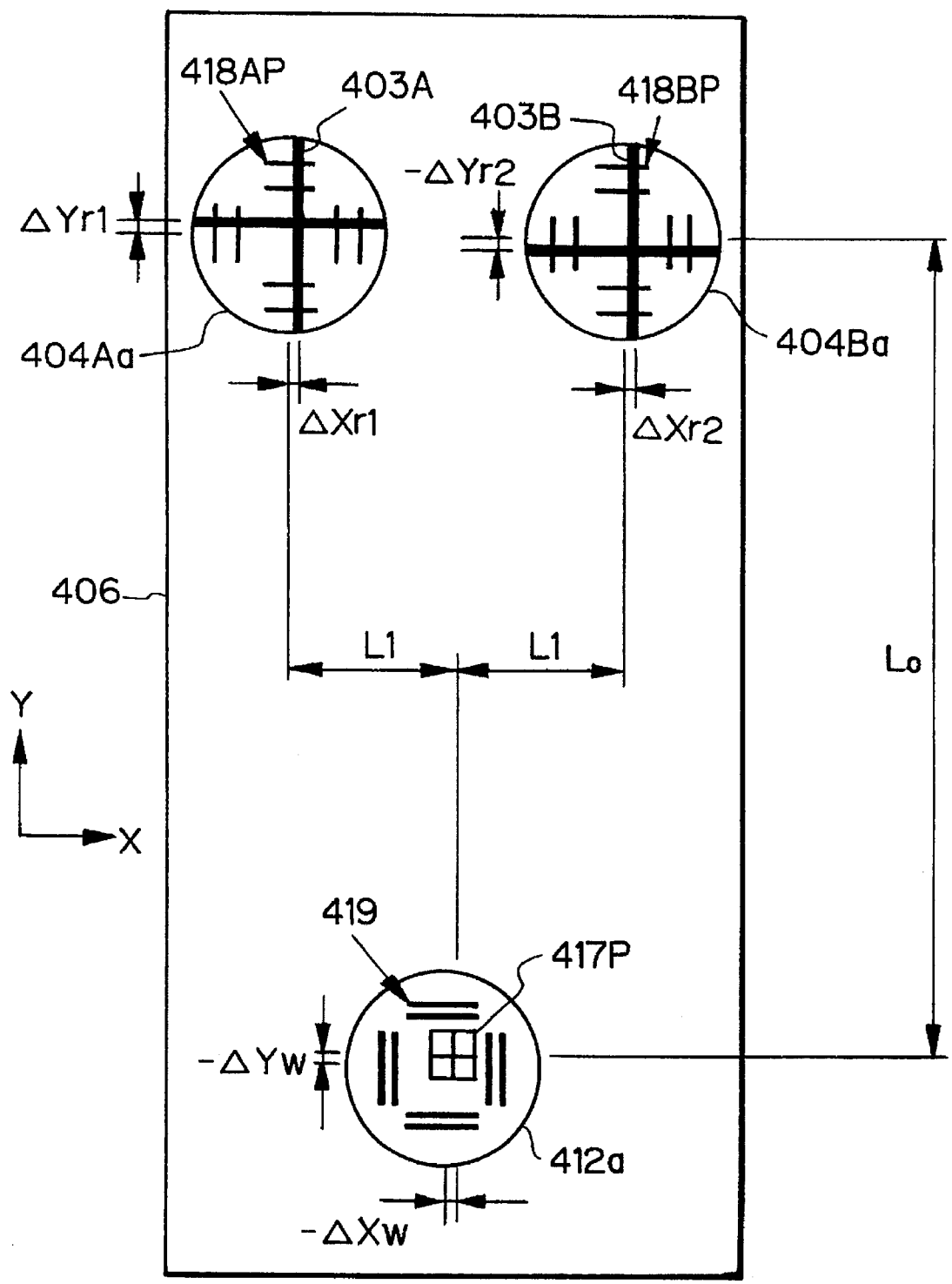
FIG. 10 is a schematic illustration showing marks (or mark images) in a viewing field of a reticle alignment optical system and a wafer alignment optical system of the apparatus of FIG. 9 during measurement of a baseline.

FIG. 10 shows viewed images in the alignment optical systems, which images correspond to the index marks and the reference mark on the reference pattern plate 406. In FIG. 10, an image 418AP obtained from the index mark 418A (FIG. 9) through the projection optical system 401 and an image 418BP obtained from the index mark 418B through the projection optical system 401 are formed within viewing fields 404Aa, 404Ba of the reticle alignment optical systems 404A, 404B (FIG. 9), respectively. Each of the index marks 418A, 418B is constituted by two-line patterns spaced apart from each other by a predetermined distance in the X-direction and other two-line patterns spaced apart from each other by a predetermined distance in the Y-direction. When the reticle alignment is performed, the alignment marks 403A, 403B on the reticle 402 (FIG. 9) are positioned within the viewing fields 404Aa, 404Ba, and the reticle alignment optical systems 404A, 404B can pick-up the index mark images 418AP, 418BP and the images of the alignment marks 403A, 403B, respectively. By treating signals regarding these images, the positional deviation amounts of the alignment marks 403A, 403B with respect to the index marks 418A, 418B on the reference pattern plate 406 can be detected, and the detected results are sent to the main control system 411.

On the other hand, an image 417P corresponding to the reference mark 417 (FIG. 9) is formed within a viewing field 412a of the wafer alignment optical system 412 (FIG. 9).

And, in the wafer alignment optical system 412, an index mark 419 provided in this system and the image 417P are picked-up by an image pick-up element. By treating signals regarding the picked-up images, the positional deviation amount of the index mark 419 with respect to the reference mark 417 can be detected, and the detected result is sent to the main control system 411.

In FIG. 10, a straight line passing through the centers of the index marks 418A, 418B (which are represented by the images 418AP, 418BP in FIG. 10) is in parallel with the X axis, and a straight line passing through the center of the reference mark 417 (which is represented by the image 417P in FIG. 10) and extending in parallel with the Y axis passes through the center between the index marks 418A, 418B. That is to say, a distance between the center of the index mark 418A and the straight line passing through the center of the reference mark 417 and extending in parallel with the Y axis and a distance between the center of the index mark 418B and the same line are both $L_1$. A distance between the center of the reference mark 417 and the straight line passing through the centers of the index marks 418A, 418B and extending in parallel with the X axis is $L_0$.

Returning to FIG. 9, during the reticle alignment, by driving the XY stage 410, the reference pattern plate 406 is positioned so that the index marks 418A, 418B on the reference pattern plate 406 are brought to positions where the index marks become substantially conjugate with the alignment marks 403A, 403B on the reticle 402. In this condition, in the reticle alignment optical system 404A, the image of the index mark 418A obtained through the projection optical system 401 and the alignment mark 403A can be observed simultaneously, and, in the other reticle alignment optical system 404B, the image of the index mark 418B obtained through the projection optical system 401 and the alignment mark 403B can be observed simultaneously. Further, in this condition, the reference mark 417 on the reference pattern plate 406 can also be observed by the wafer alignment optical system 412.

Next, a focus position detecting system (referred to as "AF sensor" hereinafter) for detecting the position of the surface of the wafer W or the surface of the reference pattern plate 406 in the Z-direction will be explained. First of all, detection light (which is not sensitive to the photoresist on the wafer) emitted from a light sending system 413 of the AF sensor forms a slit image 414 on a measurement point at the center (on the optical axis) of the exposure field of the projection optical system 401 from a direction oblique to the optical axis of the projection optical System 401. In FIG. 9, the slit image 414 is projected onto a position near the center between the index marks 418A, 418B on the reference pattern plate 406. The focus position at such a center on the reference pattern plate 406 can be assumed as the focus positions of the index marks 418A, 418B. Light reflected from the measurement point re-focuses the slit image on a vibrating slit plate in a light receiving system 415. Light flux passed through the vibrating slit plate is photoelectrically converted by a photo-electrical detector in the light receiving system 415 to form a photo-electrical conversion signal. The photo-electrical conversion signal is detected in synchronous with a drive signal for the vibrating slit plate by means of a synchronous detection circuit provided in the light receiving system, thereby obtaining a focus signal SAF which is in turn sent to an offset calculation portion 416.

In this case, when the focus position of the surface of the reference pattern plate 406 is changed, since the focus signal $S_{AF}$ is also changed substantially linearly within a predetermined range, the focus position of the reference pattern plate 406 can be determined on the basis of the focus signal $S_{AF}$. Before the exposure is performed, the optical systems are previously adjusted so that, when the surface of the reference pattern plate 406 coincides with the imaging plane of the projection optical system 410 (i.e. the best focus plane of the reticle alignment optical systems 404A, 404B), the focus signal $S_{AF}$ becomes zero. Accordingly, in the offset calculation portion 416, a deviation amount $\Delta Zb1$ (defocus amount) of the surface of the reference pattern plate 406 with respect to the imaging plane of the projection optical system 401 can be determined on the basis of the value of the focus signal $S_{AF}$. The determined defocus amount is sent to the main control system 411. Further, in the illustrated embodiment, in a condition that the up/down mechanisms 409A–409C are positioned at predetermined levels, a deviation amount between the focus position of the imaging plane of the projection optical system 401 and the focus position of the best focus plane of the wafer alignment optical system 412 is previously stored as focus offset $\delta_{OFF}$, so that a defocus amount ($\Delta Zb1+\delta_{OFF}$) obtained by adding the focus offset $\delta_{OFF}$ to the defocus amount $\Delta Zb1$ regarding the projection optical system 401 is sent to the main control system 411 as a defocus amount of the reference pattern plate 406 with respect to the wafer alignment optical system 412.

In the main control system 411, when the reticle alignment is performed, the heights (extension/contraction amounts) of three up/down mechanisms 409A–409C are adjusted on the basis of the two defocus amounts $\Delta Zb1$ and ($\Delta Zb1+\delta_{OFF}$), thereby adjusting the height and inclination angle of the reference pattern plate 406. Incidentally, the wafer alignment optical system 412 may be provided with a focus position detecting system independently so that the defocus amount of the focus plane of the surface of the reference pattern plate 406 with respect to the best focus plane of the wafer alignment optical system 412 can be directly detected by means of the focus position detecting system.

The main control system 411 also serves to monitor various factors causing the change in the imaging plane of the projection optical system 401 (for example, change in the atmospheric pressure, exposure illumination light acting on the projection optical system 401 and the like) so that change amounts $\Delta ZR$ of the positions of the best focus planes of the reticle alignment optical systems 404A, 404B, as well as the projection optical system 401 are calculated. Accordingly, the actual defocus amounts of the best focus planes of the reticle alignment optical systems 404A, 404B become ($\Delta Zb1-\Delta Z_R$). If the change in the best focus plane of the wafer alignment optical system 412 caused due to the change in the atmospheric pressure is serious, the main control system 411 can calculate an amount $\Delta ZW$ of such change in the best focus plane. In this case, the defocus amount of the of the wafer alignment optical system 412 becomes ($\Delta Zb1+\delta_{OFF}-\Delta Z_W$). The main control system 411 controls the height and inclination angle of the reference pattern plate 406 on the basis of the corrected defocus amounts.

Now, the up/down mechanisms 409A–409C used in the illustrated embodiment will be explained with reference to FIG. 11.

Figure 11:
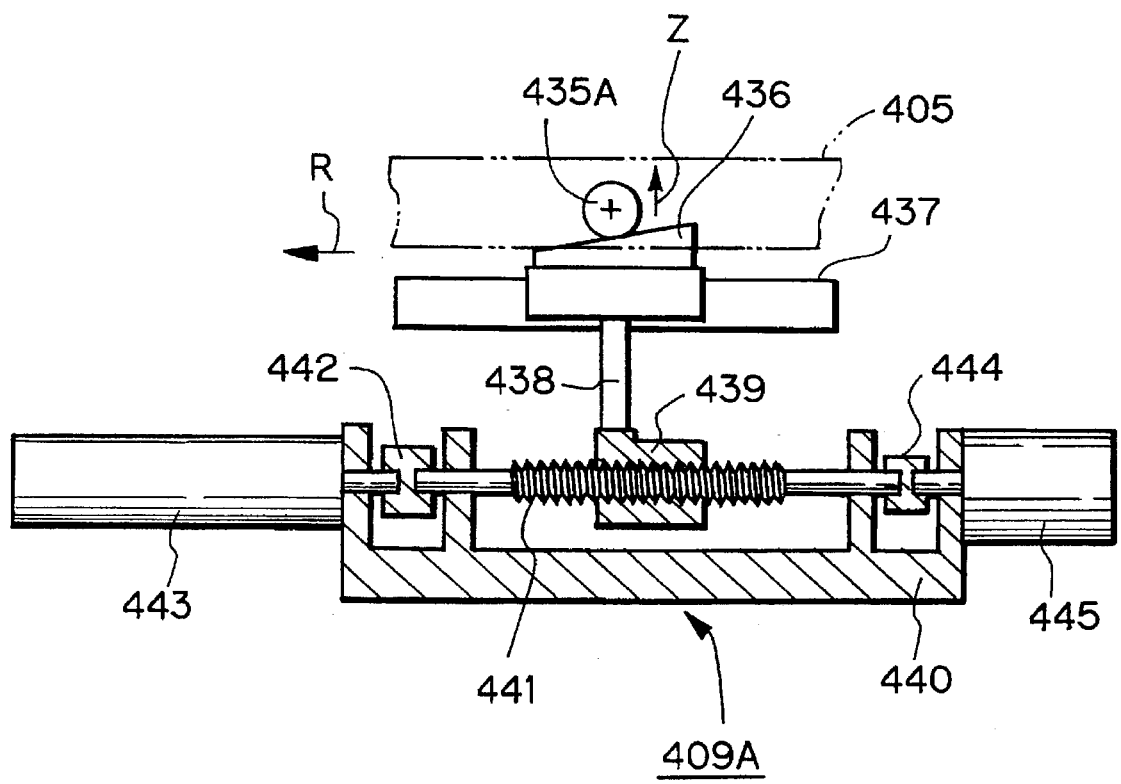
FIG. 11 is a view, in partial section, of an up/down mechanism of the apparatus of FIG. 9.

FIG. 11 is a sectional view of the up/down mechanism 409A. In FIG. 11, a drive mechanism housing 440 is secured on the XY stage 410 (FIG. 9). A feed screw 441 is rotatably mounted within the drive mechanism housing 440. A rotary motor 443 is connected to the left end of the feed screw 441 via a coupling 442, and a rotary encoder 445 for detecting a rotational angle is connected to the right end of the feed screw 441 via a coupling 444. A nut 439 is threaded on the feed screw 441. A ramp member 436 having an upper inclined surface is secured to the nut 439 via a post 438, and a rotary member 435A is contacted with the upper inclined surface of the ramp member 436. The rotary member 435A is mounted within the Z leveling table 405 in such a manner that it can be freely rotated but cannot be shifted laterally.

The ramp member 436 is supported to be shifted along a straight guide 437 in a direction parallel to the feed screw 441. In this case, the drive command from the main control system 411 (FIG. 9) is supplied to the rotary motor 443, with the result that the rotary motor 443 causes the feed screw 441 to rotate at a commanded rotational angular speed. Consequently, the nut 439 is shifted along the feed screw 411 in a direction shown by the arrow R, thereby shifting the ramp member 436 along the feed screw 441. Thus, the rotary member 435A contacted with the upper surface of the ramp member 436 is displaced in an up-and-down direction (Z-direction) with respect to the drive mechanism housing 440 while being rotated. By measuring the rotational angle of the feed screw 441 by means of the rotary encoder 445, a displaced amount of the rotary member 435A in the up-and-down direction can be detected. The other up/down mechanisms 409B, 409C have the same construction as that of the up/down mechanism 409A.

Each of the up/down mechanisms 409A-409C may include a piezo-electric element, in place of the rotary motor of FIG. 11.

Next, the operation of the projection exposure apparatus according to the seventh embodiment having the above-mentioned construction will be explained with reference to a flow chart shown in FIG. 12. In the following explanation, in FIG. 9, it is assumed that circuit patterns are already formed on shot areas of the wafer W through previous processes and positioning marks (wafer marks) are formed on the respective shot areas. Now, a method for performing the exposure after the projected image of the reticle pattern is correctly aligned with each shot area will be described.

Figure 12:
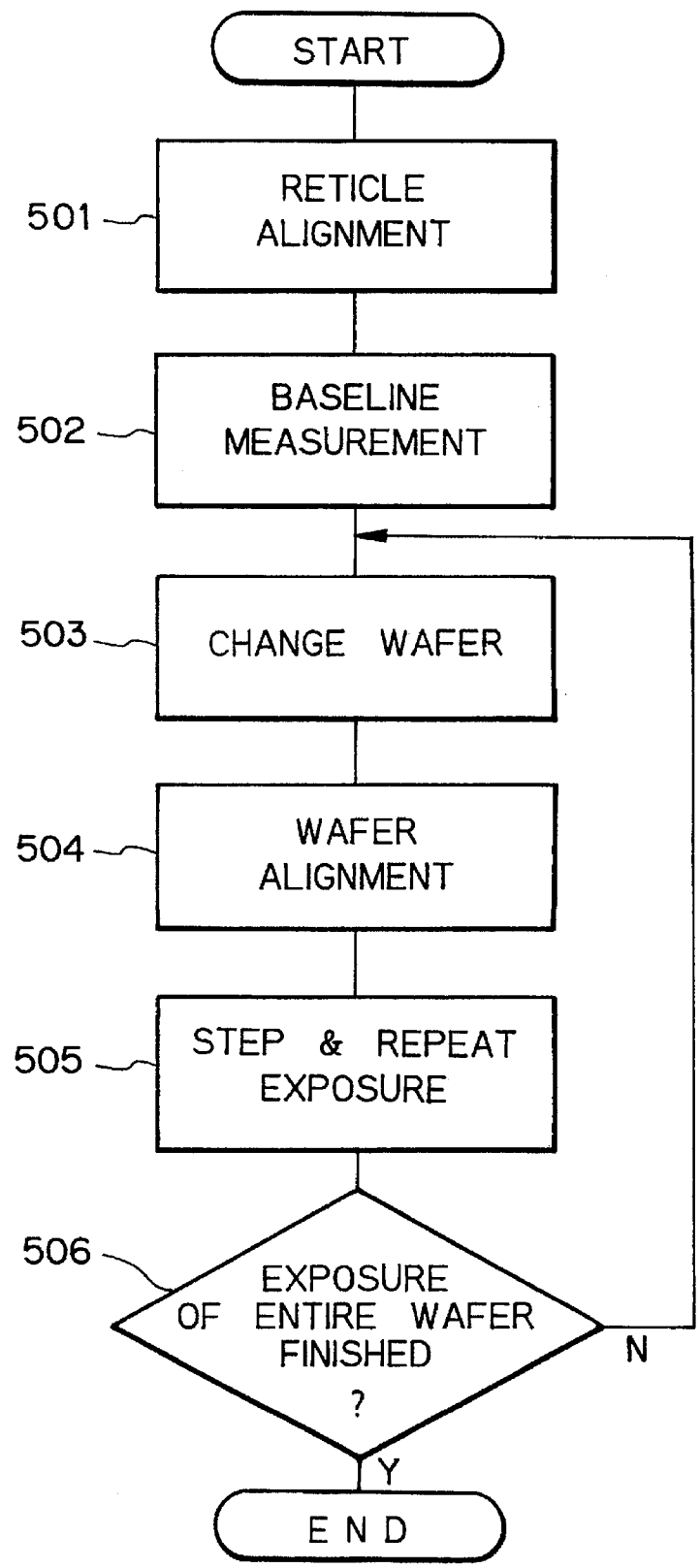
FIG. 12 is a flow chart for explaining an exposing operation including the measurement of the baseline in the apparatus of FIG. 9.

First of all, in a step 501 shown in FIG. 12, the reticle alignment is performed. That is to say, the XY stage 410 is positioned so that the index marks 418A, 418B on the reference pattern plate 406 can be observed by the reticle alignment optical systems 404A, 404B of FIG. 9. Further, the main control system 411 controls the extension/contraction amounts of the up/down mechanisms 409A-409C on the basis of the defocus amount $\Delta Zb1$ regarding the reticle alignment optical systems 404A, 404B supplied from the offset calculation portion 416, thereby aligning the surface of the reference pattern plate 406 with the focus plane of the reticle alignment optical systems 404A, 404B. In this condition, the position of the reticle 402 is finely adjusted so that the alignment marks 403A, 403B on the reticle 402 are substantially aligned with the images of the reticle alignment index marks 418A, 418B in the viewing fields of the reticle alignment optical systems 404A, 404B. In this way, the reticle alignment is completed.

In a next step 502, the baseline is measured. That is to say, the relative distances (baseline values) between the center of the projected image of the reticle pattern and the viewing center of the wafer alignment optical system 412 in the X-direction and the Y-direction are obtained. To this end, first of all, the main control system 411 controls the extension/contraction amounts of the up/down mechanisms 409A-409C on the basis of the defocus amounts $(\Delta Zb1 + \delta_{OFF})$ of the reference pattern plate 406 with respect to the wafer alignment optical system 412 supplied from the offset calculation portion 416, thereby aligning the surface of the reference pattern plate 406 with the focus plane of the reticle alignment optical systems 404A, 404B and with the focus plane of the wafer alignment optical system 412.

Figure 13:
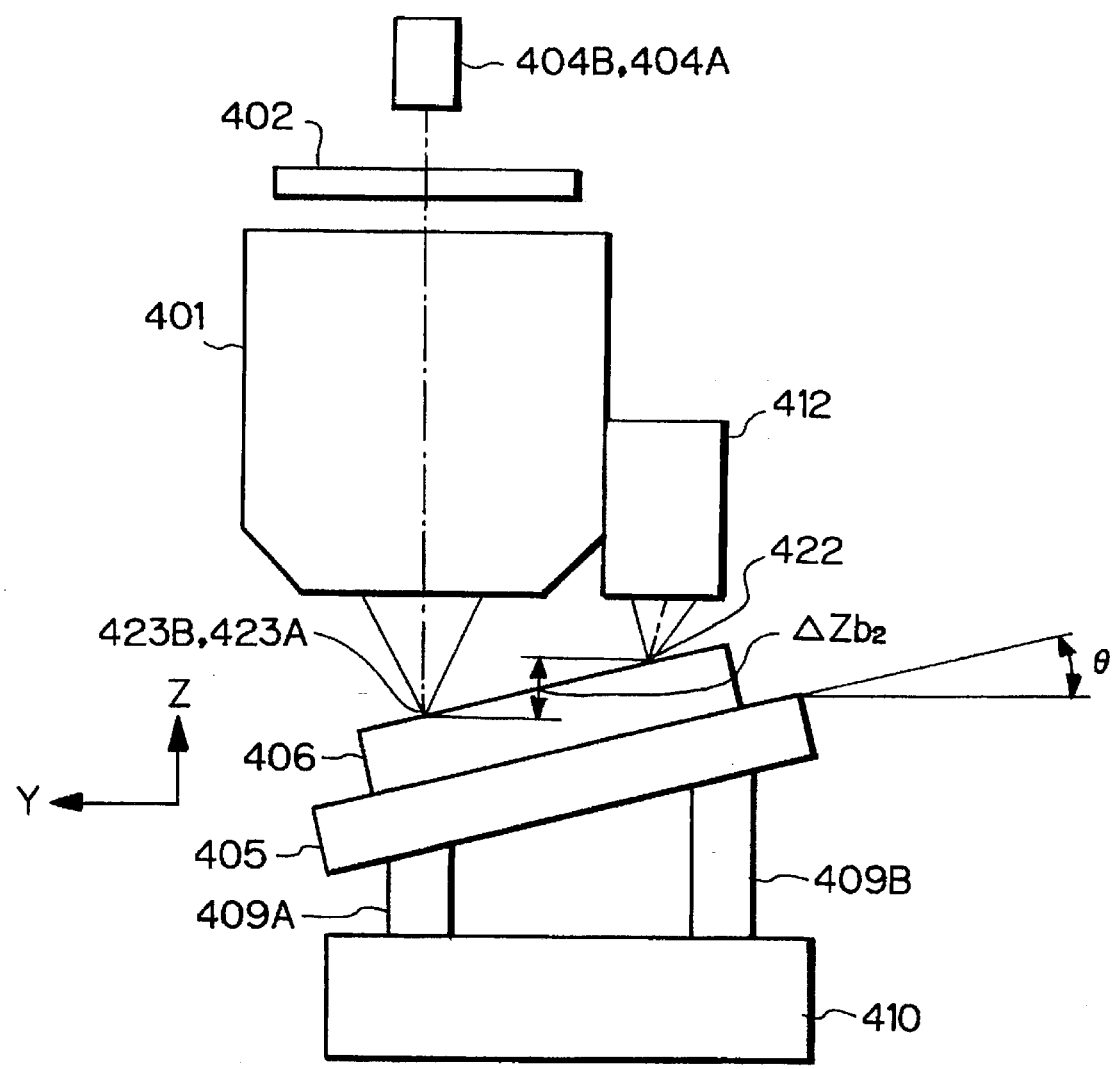
FIG. 13 is a side view showing an inclined condition of a reference pattern plate of the apparatus of FIG. 9 during the measurement of the baseline.

FIG. 13 is a side view showing a condition that the surface of the reference pattern plate is aligned with the focus planes of both reticle and wafer alignment optical systems. In FIG. 13, the surface of the reference pattern plate 406 (parallel with the surface of the Z leveling table 405) is inclined with respect to the plane of movement of the XY stage 410 in the counterclockwise direction by an angle of θ in the YZ plane, with the result that the best focus points 423A, 423B on the optical axes of the reticle alignment optical systems 404A, 404B and the best focus point 422 on the optical axis of the wafer alignment optical system 412 are positioned on the surface of the reference pattern plate 406. In the illustrated embodiment, the difference $\Delta Zb2$ between the focus positions of the best focus points 423A, 423B of the reticle alignment optical systems 404A, 404B and the focus position of the best focus point 422 of the wafer alignment optical system 412 can be obtained by correcting the focus offset amount $\delta_{OFF}$ (stored in the offset calculation portion 416) by means of the main control system 411 regarding the change in the image surface due to absorption of the exposure light and the like.

In this way, in the illustrated embodiment, the baseline amount can be measured while both the reticle alignment optical systems 404A, 404B and the wafer alignment optical system 412 are in the focused condition. Accordingly, there is no measurement error due to defocus and there is an advantage that, if the optical axis of the wafer alignment optical system 412 is inclined with respect to the Z axis to lose the telecentricity, an error corresponding to the product of the inclined angle and the defocus amount is avoided.

FIG. 10 shows the viewing fields observed by the reticle alignment optical systems 404A, 404B and the wafer alignment optical system 412 in the focused condition. In FIG. 10, the alignment marks 403A, 403B on the reticle 402 and the images 418AP, 418BP of the index marks formed on the reference pattern plate 406 are observed in the overlapped condition within the viewing fields 404Aa, 404Ba of the reticle alignment optical systems 404A, 404B. Simultaneously, the internal index mark 419 and the image 417P of the reference mark formed on the reference pattern plate 406 are observed in the overlapped condition within the viewing field 412a of the wafer alignment optical system 412.

Now, by using an appropriate process such as the image treatment, the deviation amounts $(\Delta X_{r1}, \Delta Y_{r1})$ of the alignment mark 403A with respect to the index mark 418A on the reference pattern plate 406 in the X-direction and the Y-direction, the deviation amounts $(\Delta X_{r2}, \Delta Y_{r2})$ of the alignment mark 403B with respect to the index mark 418B in the X-direction and the Y-direction, and the deviation amounts $(\Delta X_w, \Delta Y_w)$ of the index mark 419 of the wafer alignment optical system 412 with respect to the reference mark 417 on the reference pattern plate 406 in the X-direction and the Y-direction are measured or determined. Incidentally, for facilitating the explanation, in FIG. 10, the deviation amounts in the positive (+) X and Y directions are shown with no sign, and the deviation amounts in the negative (−) X and Y directions are shown with the minus (−) sign.

In the illustrated embodiment, two reticle alignment optical systems 404A, 404B are used; thus, on the basis of the measured result, the positional deviation amounts $\Delta Xr, \Delta Yr$ of the center of the projected image of the reticle pattern with respect to the reference pattern plate 406 in the X and Y directions can be calculated by using the following equations:

$$\Delta X_r = \frac{1}{2} \times (\Delta X_{r1} + \Delta X_{r2}) \quad (1)$$

$$\Delta Y_r = \frac{1}{2} \times (\Delta Y_{r1} + \Delta Y_{r2}) \quad (2)$$

In the illustrated embodiment, as shown in FIG. 10, the relative distance from the center the index marks 418A, 418B (the images of which are shown by 418AP, 418BP) for reticle alignment to the center of the reference mark 417 (the image of which is shown by 417P) has an X-direction component of zero (0) and a Y-direction component of $L_0$. However, during the measurement of the baseline, as shown in FIG. 13, if the surface of the reference pattern plate 406 is inclined with respect to the plane of moving of the XY stage 410 by the angle of θ, the relative distance from the center between the index marks 418A, 418B projected on the plane of movement of the XY stage 410 and the center of the reference mark 417 projected on the same plane will have an X-direction component of $\delta_x$ and a Y-direction component $\delta_y$ which are represented by the following equations:

$$\delta_x = 0 \quad (3)$$

$$\delta_Y = L \cos \theta \quad (4)$$

Thus, the baseline amounts Bx, By in the X-direction and the Y-direction are represented by the following equations, respectively:

$$\begin{aligned} Bx &= \delta_x + \Delta X_r - \Delta X_W \\ &= 1/2 \times (\Delta X_{r1} + \Delta X_{r2}) - \Delta X_W \end{aligned} \quad (5)$$

$$\begin{aligned} By &= \delta_y + \Delta Y_r - \Delta Y_W \\ &= L\cos\theta + 1/2 \times (\Delta Y_{r1} + \Delta Y_{r2}) - \Delta Y_W \end{aligned} \quad (6)$$

In this way, the measurement of the baseline amounts is completed.

Then, in a step 503 of FIG. 12, the wafer W to be exposed is rested on the wafer holder 407 of FIG. 9, and, in a next step 504, the wafer alignment is performed. During the wafer alignment process, the positions of the selected wafer marks (alignment marks) formed on the shot areas on the wafer W are measured by the wafer alignment optical system 412 while shifting the XY stage 410 step by step. During such measurement, as is in the measurement of the baseline amounts, the up/down mechanisms 409A–409C are driven so that the wafer mark is brought to the focus position with respect to the wafer alignment optical system 412, thereby preventing the deterioration of the reproductivity of measurement due to error in and the occurrence of error due to worsening of the telecentricity.

From the results of the above-mentioned measurements, the arrangement of the wafer marks on the wafer W or shot arrangement (i.e. the arrangement of the shot areas formed on the wafer W by the pre-treating process) with respect to the wafer alignment optical system 412 can be determined. On the basis of the measurement results and the baseline amount determined in the step 502, the shot arrangement with respect to the projected image of the reticle pattern is determined. On the basis of this result, in a step 505, the projected image of the reticle pattern is successively exposed onto the shot areas on the wafer W in the step-and-repeat fashion. In this way, a series of treatments regarding the wafer W are completed. In the next step 506, it is judged whether any wafer to be exposed remains or not. If affirmative (YES), the program returns to the step 503, where the wafer is changed to a new wafer. Then, the wafer alignment and the exposure are repeated. On the other hand, if there is no wafer to be exposed, the program is ended.

In the above-mentioned embodiment, while an example that both the reticle alignment systems 404A, 404B and the wafer alignment optical system 412 are of imaging type, i.e. FIA (Field Image Alignment) type is explained. However, for example, the present invention can be applied to a case where the wafer alignment optical system 412 comprises an alignment system of two light flux interference type in which laser beams are directed onto a wafer mark of diffraction grid type from different directions, and a position of the wafer mark is detected on the basis of a phase of interference of diffraction light beams generated in the same direction.

Further, the present invention can be applied to a case where the reticle alignment systems 404A, 404B comprise alignment systems of so-called ISS (Imaging Slit Sensor) type in which a wafer is scanned so that a position of a light passing slit on a wafer stage is detected above a reticle and the wafer alignment optical system 412 comprises an alignment system of so-called LSA (Laser Step Alignment) type in which a wafer mark consisting of dot pattern arrays is relatively scanned by laser beams condensed in a slit pattern.

In the illustrated embodiment, while an example that the focus adjustment and the levelling adjustment can be effected simultaneously with respect to the Z levelling table 405 is explained, a stage on which a levelling stage capable of permitting the levelling adjustment alone is rested can be used. Alternatively, the levelling table may be divided into two portions so that the correction of inclination of a wafer and the correction of inclination of a reference pattern plate (406) can be performed with respect to the discrete levelling table portions. However, when the focus positions and inclination angles of the wafer and the reference pattern plate 406 are adjusted by the single Z levelling stage 405, the arrangement can be According to the present invention, during the measurement of the baseline, the reference pattern member (reference pattern plate) to be measured can be brought to focus positions simultaneously with respect to a plurality of alignment measuring means. Accordingly, both the mask alignment measuring means (alignment optical system for detecting the position of the reticle) and the substrate alignment measuring means (alignment optical system for detecting the position of the wafer) can be used in the focused condition, with the result that the distance (baseline) between the exposure center of the mask pattern and the detection center of the substrate alignment measuring means can always be detected correctly.

Therefore, even if the optical axis or axes of the alignment measuring means is inclined (i.e. the telecentricity is not good), the measurement error comprised of the product of the defocus amount and the deterioration amount of the telecentricity can be eliminated.

When both the reference pattern member and the exposure substrate are rested on the height and inclination correction table side by side, the stage system can be further simplified.

By providing the focus position detection means for detecting the focus deviation amount of the focus position of the reference pattern member with respect to the projection optical system and the offset calculation means for calculating the focus deviation amount of the focus position of the reference pattern member with respect to the substrate alignment measuring means on the basis of the result from the focus position detection means, and by adjusting the height and inclination angle of the reference pattern member on the basis of the detection result of the focus position detection means and the calculated result of the offset calculation means by means of the height and inclination correction table, the focusing operation regarding two alignment measuring means can be effected correctly by using the single focus position detection means.

What is claimed is:

1. A projection exposure apparatus comprising a projection optical system for projecting a pattern of a mask onto each of exposure areas on a photosensitive substrate, said projection optical system having an optical axis;

a substrate stage for moving said substrate in a plane perpendicular, to the optical axis of said projection optical system;

a mark detection system of an off-axis type spaced apart from said projection optical system by a predetermined distance for detecting positions of positioning marks formed on said substrate;

a control system for aligning each exposure area on said substrate with said mask by means of said stage on the basis of the detected positions of said positioning marks;

a height stage adapted to move along the optical axis of said projection optical system;

a focus position detection system for detecting a focus position of said substrate along the direction parallel with the optical axis of said projection optical system in the proximity of the optical axis of said projection optical system;

an environmental condition measuring sensor for measuring an environmental condition to which said projection optical system and said mark detection system of off-axis type are subjected; and an offset calculator provided in said control system and adapted to determine the amount of offset of an imaging position of said projection optical system and the amount of offset of a best focus position of said mark detection system on the basis of a change in the environmental condition measured by said environmental condition measuring sensor;

wherein said control system operates so that for the process to detect the position of said positioning mark on said substrate by said mark detection system and for the process to project the pattern of said mask on each of the exposure areas on said substrate via said projection optical system, the position of said substrate along the optical axis of said projection optical system is set through said height stage, independently between these two processes.

2. A projection exposure apparatus according to claim 1, further comprising an integrated light amount detection sensor for determining an integrated light amount of the illuminating light passing through said projection optical system, and wherein said offset calculator determines said offset amounts on the basis of said amount of change of the environmental condition and said integrated light amount.

3. A projection exposure apparatus according to claim 1, further comprising an inclination amount measuring system for measuring an inclination amount of said substrate rested on said substrate stage with respect, to a plane perpendicular to the optical axis of said projection optical system, wherein said calculator is adapted to calculate a shifting amount of said height stage required to correct a distance between said mark and said mark detection system to a predetermined value on the basis of the focus position at an optional position on said substrate determined by said focus position detection system, the inclination amount of said substrate determined by said inclination amount measuring system and arrangement information regarding the positions of the marks on said substrate, when said stage is to be positioned so that said mark is detected by said mark detection system.

4. A projection exposure apparatus according to claim 1, further comprising an inclination amount measuring system for measuring an inclination amount of said substrate rested on said substrate stage with respect to a plane perpendicular to the optical axis of said projection optical system, and a leveling stage provided on said substrate stage and adapted to incline said substrate, wherein said control system serves to cause said leveling stage to correct said substrate so that said substrate becomes perpendicular to the optical axis of said projection optical system on the basis of the inclination amount determined by said inclination amount measuring system, to cause said focus position detection system and said height stage to shift said substrate upwardly or downwardly so that a distance between said mark and said mark detection system has a predetermined value, and then to cause said mark detection system to detect the position of said positioning mark on said substrate, when said stage is to be positioned so that said mark is detected by said mark detection system.

5. A projection exposure apparatus according to claim 3, wherein said control system includes a comparison unit for comparing the inclination amount of said substrate determined by said inclination amount measuring system with a previously stored allowable value of the inclination amount of said substrate;

wherein, when said stage is to be positioned so that said mark is detected by said mark detection system, said control system serves to detect said marks without shifting said substrate upwardly or downwardly between detection of one mark and detection of a next mark when the inclination amount of said substrate determined by said inclination amount measuring system is smaller than said allowable value.

6. A projection exposure apparatus according to claim 4, wherein said control system includes a comparison unit for comparing the inclination amount of said substrate determined by said inclination amount measuring system with a previously stored allowable value of the inclination amount of said substrate;

wherein, when said stage is to be positioned so that said mark is detected by said mark detection system, said control system serves to detect said mark without operating said leveling stage when the inclination amount of said substrate determined by said inclination amount measuring system is smaller than said allowable value.

7. A projection exposure apparatus comprising a projection optical system for projecting a pattern of a mask onto each of exposure areas on a photosensitive substrate, said projection optical system having an optical axis;

a substrate stage for moving said substrate in a plane perpendicular to the optical axis of said projection optical system;

a mark detection system of an off-axis type spaced apart from said projection optical system by a predetermined distance for detecting positions of positioning marks formed on said substrate;

a control system for aligning each exposure area on said substrate with said mask by means of said stage on the basis of the detected positions of said positioning marks;

a height stage to move along the optical axis of said projection optical system;

a focus position detection system for detecting a focus position of said substrate along the direction parallel with the optical axis of said projection optical system in the proximity of the optical axis of said projection optical system;

an inclination amount measuring system for measuring an inclination amount of said substrate rested on said substrate stage with respect to a plane perpendicular to the optical axis of said projection optical system; and a calculator provided in said control system and adapted to calculate a shifting amount of said height stage required to correct a distance between said mark and said mark detection system to a predetermined value on the basis of the focus position at an optional position on said substrate determined by said focus position detection system, the inclination amount of said substrate determined by said inclination amount measuring system and arrangement information regarding the positions of the marks on said substrate, when said stage is to be positioned so that said mark is detected by said mark detection system, wherein the focusing is performed in accordance with the calculated shifting amount during the mark detection by means of said mark detection system.

8. A projection exposure apparatus according to claim 7, wherein said control system includes a comparison unit for comparing the inclination amount of said substrate determined by said inclination amount measuring system with a previously stored allowable value of the inclination amount of said substrate;

wherein, when said stage is to be positioned so that said mark is detected by said mark detection system, said control system serves to detect said marks without shifting said substrate upwardly or downwardly between detection of one mark and detection of a next mark when the inclination amount of said substrate determined by said inclination amount measuring system is smaller than said allowable value.

9. A projection exposure apparatus comprising a projection optical system for projecting a pattern of a mask onto each of exposure areas on a photosensitive substrate, said projection optical system having an optical axis;

a substrate stage for moving said substrate in a plane perpendicular to the optical axis of said projection optical system;

a mark detection system of an off-axis type spaced apart from said projection optical system by a predetermined distance for detecting positions of positioning marks formed on said substrate;

a control system for aligning each exposure area on said substrate with said mask by means of said stage on the basis of the detected positions of said positioning marks;

a height stage adapted to move along the optical axis of said projection optical system;

a focus position detection system for detecting a focus position of said substrate along the direction parallel with the optical axis of said projection optical system in the proximity of the optical axis of said projection optical system;

an inclination amount measuring system for measuring an inclination amount of said substrate rested on said substrate stage with respect to a plane perpendicular to the optical axis of said projection optical system; and a leveling stage provided on said substrate stage and adapted to incline said substrate, wherein said control system serves to cause said leveling stage to correct said substrate so that said substrate becomes perpendicular to the optical axis of said projection optical system on the basis of the inclination amount determined by said inclination amount measuring system, to cause said focus position detection system and said height stage to shift said substrate upwardly or downwardly so that a distance between said mark and said mark detection system has a predetermined value, and then to cause said mark detection system to detect the position of said positioning mark on said substrate, when said stage is to be positioned so that said mark is detected by said mark detection system.

10. A projection exposure apparatus according to claim 9, wherein said control system includes a comparison unit for comparing the inclination amount of said substrate determined by said inclination amount measuring system with a previously stored allowable value of the inclination amount of said substrate;

wherein, when said stage is to be positioned so that said mark is detected by said mark detection system, said control system serves to detect said mark without operating said leveling stage when the inclination amount of said substrate determined by said inclination amount measuring system is smaller than said allowable value.

11. A projection exposure apparatus comprising a projection optical system for projecting a pattern of a mask onto each of exposure areas on a photosensitive substrate, said projection optical system having an optical axis;

a substrate stage for moving said substrate in a plane perpendicular to the optical axis of said projection optical system;

a mark detection system of an off-axis type spaced apart from said projection optical system by a predetermined distance for detecting positions of positioning marks on said substrate;

a control system for aligning each exposure area on said substrate with said mask by means of said stage on the basis of the detected positions of said positioning marks;

a height stage adapted to move along the optical axis of said projection optical system;

a focus position detection system for detecting a focus position of said substrate along the direction parallel with the optical axis of said projection optical system in the proximity of the optical axis of said projection optical system;

an inclination amount measuring system for measuring an inclination amount of said substrate rested on said substrate stage with respect to a plane perpendicular to the optical axis of said projection optical system; and a comparison unit for comparing the inclination amount of said substrate determined by said inclination amount measuring system with a previously stored allowable value of the inclination amount of said substrate, wherein, when said stage is to be positioned so that said mark is detected by said mark detection system, and when it is judged that the inclination amount of said substrate determined by said inclination amount measuring system is greater than said allowable value, said control system serves to control said focus position detection system and said height stage to shift said substrate upwardly and downwardly so that a distance between said mark and said mark detection system has a predetermined value.

12. A method for projecting a pattern of a mask on a photosensitive substrate in a projection exposure apparatus including a projection optical system for projecting said pattern of the mask onto each of exposure areas on said substrate, said projection optical system having an optical axis; a substrate stage for moving the substrate in a plane perpendicular to said optical axis; a mark detection system of an off-axis type spaced apart from said projection optical system by a predetermined distance for detecting positions of positioning marks formed on said substrate; and a control system for aligning each exposure area on said substrate with said mask by means of said stage on the basis of the detected positions of said positioning marks, said method comprising providing a focus position detection system for detecting a focus position of said substrate along the direction parallel with the optical axis of said projection system in the proximity of the optical axis of said optical system;

sensing an environmental condition to which said projection optical system and said mark detection system are subjected so as to measure the change in the environmental condition;

calculating the amount of offset of an imaging position of said optical system and the amount of offset of the best focus position of said mark detection system on the basis of said change in the environmental condition;

adjusting said focus position detection system on the basis of the calculated amount of offset of the best focus position of said mark detection system; and moving said substrate along said optical axis so that the substrate is brought to said best focus position determined by said focus position detection system and then effecting the process to detect the position of the positioning mark by said mark detection system.

13. A method for projecting a pattern of a mask according to claim 12 further comprising determining the amount of inclination of said substrate rested on said substrate stage with respect to a plane perpendicular to said optical axis;

calculating a shifting amount of said substrate required to correct a distance between said mark and said mark detection system on the basis of the focus position at an optional position on said substrate determined by said focus position detection system, said determined inclination amount of the substrate and an arrangement information regarding the positions of the marks; and shifting said substrate along said optical axis by the distance corresponding to said shifting amount.

14. A method for projecting a pattern of a mask according to claim 12 further comprising providing a leveling stage on said substrate stage so as to change the inclination of said substrate; and determining the amount of inclination of said substrate rested on said substrate stage with respect to a plane perpendicular to said optical axis, wherein, before said step of moving the substrate, said leveling stage is actuated on the basis of said determined inclination amount so that said substrate becomes perpendicular to said optical axis.

15. A method for projecting a pattern of a mask according to claim 13 further comprising comparing said determined inclination amount with a previously stored allowable value of the inclination amount; and canceling said step of shifting said substrate when the determined inclination amount is smaller than said allowable value.

16. A method for projecting a pattern of a mask according to claim 14 further comprising comparing said determined inclination amount with a previously stored allowable value of the inclination amount; and canceling said step of actuating said leveling stage when the determined inclination amount is smaller than said allowable value.

17. A method for projecting a pattern of a mask on a photosensitive substrate in a projection exposure apparatus including a projection optical system for projecting said pattern of the mask onto each of exposure areas on said substrate, said projection optical system having an optical axis; a substrate stage for moving the substrate in a plane perpendicular to said optical axis; a mark detection system of an off-axis type spaced apart from said projection optical system by a predetermined distance for detecting positions of positioning marks formed on said substrate; and a control system for aligning each exposure area on said substrate with said mask by means of said stage on the basis of the detected positions of said positioning marks, said method comprising providing a focus position detection system for detecting a focus position of said substrate along the direction parallel with the optical axis of said projection optical system in the proximity of the optical axis of said projection optical system;

determining the amount of inclination of said substrate rested on said substrate stage with respect to a plane perpendicular to said optical axis;

calculating a shifting amount of said substrate required to correct a distance between said mark and said mark detection system on the basis of the focus position at an optional position on said substrate determined by said focus position detection system, said determined inclination amount of the substrate and an arrangement information regarding the positions of the marks; and moving said substrate along said optical axis based on the value determined by said focus position detection system and said calculated shifting amount so that the substrate is brought to the best focus position of said mark detection system.

18. A method for projecting a pattern of a mask according to claim 17 further comprising comparing said determined inclination amount with a previously stored allowable value of the inclination amount; and canceling said step of moving said substrate between detection processes of the marks when the determined inclination amount is smaller than said allowed value.

19. A method for projecting a pattern of a mask on a photosensitive substrate in a projection exposure apparatus including a projection optical system for projecting said pattern of the mask onto each of exposure areas on said substrate, said projection optical system having an optical axis; a substrate stage for moving the substrate in a plane perpendicular to said optical axis; a mark detection system of an off-axis type spaced apart from said projection optical system by a predetermined distance for detecting positions of positioning marks formed on said substrate; and a control system for aligning each exposure area on said substrate with said mask by means of said stage on the basis of the detected positions of said positioning marks, said method comprising providing a focus position detection system for detecting a focus position of said substrate along the direction parallel with the optical axis of said projection system in the proximity of the optical axis of said optical system;

determining the amount of inclination of said substrate rested on said substrate stage with respect to a plane perpendicular to said optical axis;

providing a leveling stage on said substrate stage so as to change the inclination of said substrate;

actuating said leveling stage on the basis of said determined inclination amount so that said substrate becomes perpendicular to said optical axis;

moving said substrate along said optical axis so that the substrate is brought to the best focus position of said mark detection system determined by said focus position detection system and then effecting the process to detect the position of the positioning mark by said mark detection system.

20. A method for projecting a pattern of a mask according to claim 19 further comprising comparing said determined inclination amount with a previously stored allowable value of the inclination amount; and canceling said step of actuating said leveling stage when said determined inclination amount is smaller than said allowable value.

21. A method for projecting a pattern of a mask on a photosensitive substrate in a projection exposure apparatus including a projection optical system for projecting said pattern of the mask onto each of exposure areas on said substrate, said projection optical system having an optical axis; a substrate stage for moving the substrate in a plane perpendicular to said optical axis; a mark detection system of an off-axis type spaced apart from said projection optical system by a predetermined distance for detecting positions of positioning marks formed on said substrate; and a control system for aligning each exposure area on said substrate with said mask by means of said stage on the basis of the detected positions of said positioning marks, said method comprising providing a focus position detection system for detecting a focus position of said substrate along the direction parallel with the optical axis of said projection optical system in the proximity of the optical axis of said projection optical system;

providing a height stage adapted to move along the optical axis of said projection optical system;

determining the amount of inclination of said substrate rested on said substrate stage with respect to a plane perpendicular to said optical axis;

comparing said determined inclination amount with a previously stored allowable value of the inclination amount; and, controlling said focus position detection system and said height stage, when it is judged that said determined inclination amount of said substrate is greater than said allowable value, to shift said substrate upwardly and downwardly so that a distance between said mark and said mark detection system has a predetermined value.

22. An exposure method comprising the steps of (1) adjusting a projection optical system for projecting a pattern of a mask onto a photosensitive substrate so as to bring an imaging feature of said projection optical system to a predetermined imaging feature;

(2) positioning a surface of said substrate to a focusing plane of an off-axis alignment system;

(3) positioning an alignment mark on said substrate to a mark detecting position of the alignment system by shifting a shiftable stage on which said substrate is rested in a plane perpendicular to an optical axis of said projection optical system, and detecting a position of the alignment mark at said mark detecting position to output a detected value;

(4) shifting a predetermined shot area on said substrate to a position just below said projection optical system by shifting said shiftable stage in the plane perpendicular to the optical axis of said projection optical system on the basis of said detected value;

(5) positioning a surface of said predetermined shot area to an imaging plane of said projection optical system; and (6) projecting the pattern onto said substrate for exposure.

23. A projection exposure apparatus comprising a projection optical system for projecting a pattern of a mask onto a photosensitive substrate, a shiftable stage on which said substrate is rested and which can be shifted in a plane perpendicular to an optical axis of said projection optical system, and an off-axis alignment system disposed adjacent to said projection optical system and adapted to detect a mark position of an alignment mark on said substrate, and wherein the position of the alignment mark is detected by said alignment system and said shiftable stage is shifted on the basis of the position of the mark detected by said alignment system to effect exposure, characterized in that it further comprises an auto-focus portion for shifting said substrate along a direction of the optical axis of said projection optical system to bring a surface of said substrate to a predetermined position;

an imaging feature adjusting portion for adjusting an image of the pattern projected on said substrate to a predetermined condition;

a calculation portion for outputting a difference ($\Delta Za$) between an imaging plane of said projection optical system and a focusing plane of said alignment system, on the basis of an adjusted amount effected by said adjusting portion; and a control portion for adjusting said auto-focus portion on the basis of the difference ($\Delta Za$) to position the surface of said substrate to the focusing plane.

24. An exposure method comprising the steps of (1) adjusting a projection optical system for projecting a pattern of a mask onto a photosensitive substrate so as to bring an imaging feature of said projection optical system to a predetermined imaging feature;

(2) positioning a surface of said substrate to an imaging plane of said projection optical system;

(3) positioning an alignment mark on said substrate to a mark detecting position of an off-axis alignment system by shifting a shiftable stage on which said substrate is rested in a plane perpendicular to an optical axis of said projection optical system, and detecting a position of the alignment mark at said mark detecting position to output a detected value;

(4) calculating a deviation amount ($\Delta X$) of the detected mark position on the basis of a difference ($\Delta Za$) between an imaging plane of said projection optical system and a focusing plane of said alignment system in an optical axis direction;

(5) correcting said detected value obtained in the step (3) by adding the deviation amount ($\Delta X$) to the detected value, and shifting a predetermined shot area on said substrate to a position just below said projection optical system by shifting said shiftable stage in the plane perpendicular to the optical axis of said projection optical system on the basis of the corrected detected value; and (6) projecting the pattern onto said substrate for exposure.

25. An exposure method according to claim 24, wherein the deviation amount ($\Delta X$) is caused by a telecentricity error of said alignment system.

26. A projection exposure apparatus comprising a projection optical system for projecting a pattern of a mask onto a photosensitive substrate, a shiftable stage on which said substrate is rested and which can be shifted in a plane perpendicular to an optical axis of said projection optical system, and an off-axis alignment system disposed adjacent to said projection optical system and adapted to detect a mark position of an alignment mark on said substrate, and wherein the position of the alignment mark is detected by said alignment system to provide a detected value and said shiftable stage is shifted on the basis of the position of the mark detected by said alignment system to effect exposure, characterized in that it further comprises:

an auto-focus portion for shifting said substrate along a direction of the optical axis of said projection optical system to bring a surface of said substrate to an imaging plane of said projection optical system;

an imaging feature adjusting portion for adjusting an image of the pattern projected on said substrate to a predetermined condition;

a calculation portion for outputting a difference ($\Delta Za$) between the adjusted imaging plane and a focusing plane of said alignment system; and a correction portion for calculating a deviation amount ($\Delta X$) of the mark position on the basis of the difference ($\Delta Za$) and correcting said detected value of the mark position on the basis of the deviation amount ($\Delta X$).

27. An exposure apparatus according to claim 26, wherein the deviation amount ($\Delta X$) is caused by a telecentricity error of said alignment system.

28. A projection exposure apparatus comprising:
a projection optical system for projecting a pattern image formed on a mask onto a photosensitive substrate;

a substrate stage for shifting said photosensitive substrate in a plane perpendicular to an optical axis of said projection optical system;

a reference pattern member which is shifted together with said photosensitive substrate by means of said substrate stage and on which first and second reference marks are formed;

a substrate alignment detecting system for measuring the position of an alignment mark formed on said photosensitive substrate; and a mask alignment detecting system for measuring a relative positional relation between an alignment mark formed on said mask and the first reference mark formed on said reference pattern member through said projection optical system, wherein, a relative positional relation between said mask and said substrate alignment detecting system is determined by measuring a position of the second reference mark by means of said substrate alignment detecting system while measuring positional deviation of said mask with respect to the first reference mark by means of said mask alignment detecting system, and wherein, said reference pattern member is tiltable.

29. A projection exposure apparatus according to claim 28, wherein a height and inclination correction table for adjusting the position of a surface of said reference pattern member in a direction along the optical axis of said projection optical system and an inclination angle of the same surface is provided on said substrate stage.

30. A projection exposure apparatus according to claim 28, wherein said photosensitive substrate is rested on said height and inclination correction table in a side-by-side relationship with said reference pattern member.

31. A projection exposure apparatus according to claim 29 or 30, further comprising:

a focus position detecting system for detecting a deviation amount of said reference pattern member from a focus point of said projection optical system; and an offset calculation unit for calculating a focus deviation amount of said reference pattern member from a focus point of said substrate alignment detecting system on the basis of a detected result of said focus position detecting system, wherein, on the basis of the detected result of said focus position detecting system, and a calculated result of said offset calculation unit, the height and the inclination angle of said reference pattern member are adjusted.

* * * * *

UNITED STATES PATENT AND TRADEMARK OFFICE
CERTIFICATE OF CORRECTION

PATENT NO.:      5,654,553
DATED      :     August 5, 1997
INVENTOR(S):     KAWAKUBO et al.

It is certified that error appears in the above-identified patent and that said Letters Patent is hereby corrected as shown below:

On the title page of the patent item [30], the Foreign Application Priority Data, is incorrect in that the date of one of the foreign priorities is in error. Please change "Dec. 9, 1994 [JP] Japan .....6-304524" to be --Dec. 8, 1994 [JP] Japan .....6-304524-- therefor.

Signed and Sealed this

Third Day of March, 1998

BRUCE LEHMAN

*Attest:*

*Attesting Officer*     *Commissioner of Patents and Trademarks*